(12) United States Patent
Park et al.

(10) Patent No.: US 7,537,977 B2
(45) Date of Patent: May 26, 2009

(54) METHOD FOR MANUFACTURING A THIN FILM TRANSISTOR ARRAY PANEL FOR A LIQUID CRYSTAL DISPLAY AND A PHOTOLITHOGRAPHY METHOD FOR FABRICATING THIN FILMS

(75) Inventors: Woon-Yong Park, Suwon (KR); Bum-Ki Baek, Suwon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 149 days.

(21) Appl. No.: 11/716,228

(22) Filed: Mar. 9, 2007

(65) Prior Publication Data
US 2007/0152224 A1 Jul. 5, 2007

Related U.S. Application Data

(60) Division of application No. 11/233,038, filed on Sep. 23, 2005, now Pat. No. 7,202,502, which is a continuation of application No. 10/627,752, filed on Jul. 28, 2003, now abandoned, which is a division of application No. 09/968,522, filed on Oct. 2, 2001, now Pat. No. 6,621,545, which is a division of application No. 09/417,045, filed on Oct. 12, 1999, now Pat. No. 6,335,276.

(30) Foreign Application Priority Data

Nov. 26, 1998 (KR) ............... 1998-50880
Feb. 22, 1999 (KR) ................ 1999-5828

(51) Int. Cl.
*H01L 21/00* (2006.01)

(52) U.S. Cl. .............. 438/149; 438/151; 438/148
(58) Field of Classification Search ......... 438/148–149, 438/151
See application file for complete search history.

(56) References Cited

U.S. PATENT DOCUMENTS 4,865,945 A 9/1989 Noguchi et al.

(Continued)

FOREIGN PATENT DOCUMENTS

JP 62-281428 12/1987
KR 2000-1757 1/2000

OTHER PUBLICATIONS

Korean Patent Abstracts, Publication No. 1020000001757, Jan. 15, 2000. 1p.

*Primary Examiner*—Laura M Menz
(74) *Attorney, Agent, or Firm*—Haynes and Boone LLP

(57) ABSTRACT

A thin film transistor (TFT) array panel that includes a substrate, a gate wire formed on the substrate, a gate insulating layer pattern formed on the gate wire, a semiconductor layer pattern formed on the gate insulating layer pattern, an ohmic contact layer pattern formed on the semiconductor layer pattern, a data wire formed on the ohmic contact layer pattern, a passivation layer pattern formed on the data wire, and a pixel electrode is presented. The data wire includes a data pad. The ohmic contact layer pattern includes a portion disposed under the data pad that is simultaneously etched as the data pad, and a contact hole in the passivation layer is etched simultaneously as a contact hole in the gate insulating layer.

3 Claims, 37 Drawing Sheets

U.S. PATENT DOCUMENTS

| | | | |
|---|---|---|---|
| 5,882,827 A | 3/1999 | Nakao | |
| 6,133,977 A | 10/2000 | Lee et al. | |
| 6,215,541 B1 * | 4/2001 | Song et al. | 349/141 |
| 6,255,130 B1 | 7/2001 | Kim | |
| 6,256,077 B1 | 7/2001 | Baek | |
| 6,287,899 B1 * | 9/2001 | Park et al. | 438/149 |
| 6,300,152 B1 | 10/2001 | Kim | |
| 6,335,211 B1 * | 1/2002 | Lee | 438/22 |
| 6,335,276 B1 * | 1/2002 | Park et al. | 438/648 |
| 6,380,559 B1 * | 4/2002 | Park et al. | 257/59 |
| 6,429,057 B1 * | 8/2002 | Hong et al. | 438/158 |
| 6,451,635 B2 * | 9/2002 | Park et al. | 438/158 |
| 6,524,876 B1 | 2/2003 | Baek et al. | |
| 6,531,392 B2 | 3/2003 | Song et al. | |
| 6,586,286 B2 * | 7/2003 | Park et al. | 438/155 |
| 6,611,309 B2 | 8/2003 | Park et al. | |
| 6,621,545 B2 * | 9/2003 | Park et al. | 349/141 |
| 6,642,074 B2 * | 11/2003 | Hong et al. | 438/30 |
| 6,678,018 B2 * | 1/2004 | Park et al. | 349/43 |
| 6,737,289 B2 * | 5/2004 | Woo et al. | 438/30 |
| 6,737,305 B2 * | 5/2004 | Lee et al. | 438/151 |
| 6,759,281 B1 | 7/2004 | Kim et al. | |
| 6,787,809 B2 * | 9/2004 | Hong et al. | 257/72 |
| 6,806,937 B2 | 10/2004 | Park et al. | |
| 6,838,696 B2 * | 1/2005 | Kobayashi et al. | 257/57 |
| 6,927,464 B2 * | 8/2005 | Kim et al. | 257/412 |
| 6,933,568 B2 * | 8/2005 | Yang et al. | 257/347 |
| 6,972,820 B2 * | 12/2005 | Lee et al. | 349/152 |
| 7,078,255 B2 * | 7/2006 | Hong et al. | 438/30 |
| 7,084,017 B2 * | 8/2006 | Nakamura et al. | 438/149 |
| 7,098,480 B2 | 8/2006 | Kim et al. | |
| 7,102,168 B2 * | 9/2006 | Rhee et al. | 257/72 |
| 7,116,392 B2 * | 10/2006 | Baek | 349/187 |
| 7,176,496 B2 * | 2/2007 | Baek et al. | 257/72 |
| 7,179,398 B2 * | 2/2007 | Park et al. | 252/79.1 |
| 7,202,502 B2 * | 4/2007 | Park et al. | 257/72 |
| 7,202,930 B2 * | 4/2007 | Woo et al. | 349/149 |
| 7,215,399 B2 * | 5/2007 | Lee et al. | 349/139 |
| 7,217,586 B2 * | 5/2007 | Lee et al. | 438/34 |
| 7,247,878 B2 * | 7/2007 | Park et al. | 257/40 |
| 7,279,370 B2 * | 10/2007 | Lim et al. | 438/155 |
| 7,292,305 B2 * | 11/2007 | Jeong et al. | 349/187 |
| 7,323,371 B2 * | 1/2008 | Yang et al. | 438/151 |
| RE40,162 E * | 3/2008 | Park et al. | 257/59 |
| 7,394,097 B2 * | 7/2008 | Kobayashi et al. | 257/59 |
| 7,414,693 B2 * | 8/2008 | Nam et al. | 349/149 |
| 2001/0041394 A1 * | 11/2001 | Park et al. | 438/151 |
| 2001/0046016 A1 | 11/2001 | Park et al. | |
| 2002/0063253 A1 * | 5/2002 | Hong et al. | 257/59 |
| 2002/0074549 A1 * | 6/2002 | Park et al. | 257/59 |
| 2002/0160555 A1 * | 10/2002 | Hong et al. | 438/158 |
| 2002/0197539 A1 * | 12/2002 | Park et al. | 430/1 |
| 2003/0071944 A1 * | 4/2003 | Baek | 349/113 |
| 2003/0085404 A1 | 5/2003 | Kim et al. | |
| 2003/0133067 A1 | 7/2003 | Park et al. | |
| 2003/0136971 A1 * | 7/2003 | Rhee et al. | 257/98 |
| 2003/0213966 A1 * | 11/2003 | Yang et al. | 257/93 |
| 2004/0036073 A1 * | 2/2004 | Hong et al. | 257/72 |
| 2004/0055997 A1 * | 3/2004 | Park et al. | 216/9 |
| 2004/0125252 A1 * | 7/2004 | Lee et al. | 349/43 |
| 2004/0195959 A1 * | 10/2004 | Park et al. | 313/500 |
| 2004/0222421 A1 * | 11/2004 | Lee et al. | 257/66 |
| 2005/0023534 A1 * | 2/2005 | Hong et al. | 257/72 |
| 2005/0077516 A1 * | 4/2005 | Lim et al. | 257/59 |
| 2005/0082536 A1 | 4/2005 | Park et al. | |
| 2005/0094048 A1 * | 5/2005 | Baek | 349/43 |
| 2005/0148143 A1 * | 7/2005 | Yang et al. | 438/283 |
| 2006/0011921 A1 * | 1/2006 | Park et al. | 257/72 |
| 2006/0038956 A1 * | 2/2006 | Lee et al. | 349/187 |
| 2006/0038957 A1 * | 2/2006 | Lee et al. | 349/187 |
| 2006/0038958 A1 * | 2/2006 | Lee et al. | 349/187 |
| 2006/0157712 A1 | 7/2006 | Kim et al. | |
| 2006/0228821 A1 * | 10/2006 | Hong et al. | 438/30 |
| 2006/0252168 A1 * | 11/2006 | Rhee et al. | 438/28 |
| 2006/0262244 A1 * | 11/2006 | Cho et al. | 349/84 |
| 2007/0013840 A1 * | 1/2007 | Baek | 349/114 |
| 2007/0152224 A1 * | 7/2007 | Woon-Yong et al. | 257/72 |
| 2007/0166894 A1 * | 7/2007 | Lim | 438/151 |
| 2007/0184587 A1 * | 8/2007 | You et al. | 438/149 |
| 2007/0187677 A1 * | 8/2007 | Park et al. | 257/40 |
| 2007/0262316 A1 * | 11/2007 | Kim et al. | 257/72 |
| 2008/0001154 A1 * | 1/2008 | Lee | 257/59 |
| 2008/0001155 A1 * | 1/2008 | Jung et al. | 257/59 |
| 2008/0001175 A1 * | 1/2008 | Kim et al. | 257/202 |
| 2008/0001177 A1 * | 1/2008 | Kim et al. | 257/213 |
| 2008/0002082 A1 * | 1/2008 | Lee et al. | 349/43 |
| 2008/0035971 A1 * | 2/2008 | Hong et al. | 257/296 |
| 2008/0042134 A1 * | 2/2008 | Jung et al. | 257/59 |
| 2008/0121890 A1 * | 5/2008 | Yang et al. | 257/66 |
| 2008/0122767 A1 * | 5/2008 | Lim et al. | 345/87 |

\* cited by examiner

METHOD FOR MANUFACTURING A THIN FILM TRANSISTOR ARRAY PANEL FOR A LIQUID CRYSTAL DISPLAY AND A PHOTOLITHOGRAPHY METHOD FOR FABRICATING THIN FILMS

CROSS REFERENCE TO RELATED APPLICATIONS

This application is a divisional of U.S. patent application Ser. No. 11/233,038, filed Sep. 23, 2005 now U.S. Pat. No. 7,202,502; which is a continuation application from U.S. patent application Ser. No. 10/627,752 filed on Jul. 28, 2003 now abandoned; which is a divisional application of U.S. patent application Ser. No. 09/968,522 filed on Oct. 2, 2001, issued as U.S. Pat. No. 6,621,545 on Sep. 16, 2003; which is a divisional application of U.S. patent application Ser. No. 09/417,045 filed on Oct. 12, 1999, issued as U.S. Pat. No. 6,335,276 on Jan. 1, 2002, which claims priority to and the benefit of Korean Patent Application Nos. 1998-50880 and 1999-5828 filed on Nov. 26, 1998 and Feb. 22, 1999, which are all hereby incorporated by reference for all purposes as if fully set forth herein.

BACKGROUND OF THE INVENTION (a) Field of the Invention

The present invention relates to a method for manufacturing a thin film transistor (TFT) panel for a liquid crystal display (LCD) by photolithography and a photolithography method for fabricating thin films, especially to a method to reduce the number of photolithography steps in manufacturing a TFT panel for an LCD.

(b) Description of the Related Art

An LCD (liquid crystal display) is one of the most popular FPDs (flat panel displays). The LCD has two panels having two kinds of electrodes for generating electric fields and a liquid crystal layer interposed therebetween. The transmittance of incident light is controlled by the intensity of the electric field applied to the liquid crystal layer.

The field-generating electrodes may be formed at each of the panels, or at one of the panel. The panel having at least one kind of the electrodes has switching elements such as thin film transistors.

In general, a TFT (thin film transistor) array panel of an LCD includes a plurality of pixel electrodes and TFTs controlling the signals supplied to the pixel electrodes. The TFT array panel is manufactured by photolithography using a plurality of photomasks, and it goes through five or six photolithography steps to complete the TFT array panel. The high costs and long time that the photolithography process bears makes it desirable to reduce the number of the photolithography steps.

Several manufacturing methods of LCDs using only four photolithography steps are suggested such as in Korean Patent Application No. 1995-189 ('189). The corresponding U.S. patent is U.S. Pat. No. 5,818,551. In the meantime, since an LCD actually requires wires for transmitting electric signals to the TFTs and wire pads for receiving the signals from outside, the full process to complete a TFT array panel requires the step of forming the pads. However, '189 does not disclose how to form the pads.

Other conventional method of manufacturing a TFT array panel using four photolithography steps is disclosed in "A TFT Manufactured by 4 Masks Process with New Photolithography (Chang Wook Han et al., Proceedings of The 18th International Display Research Conference Asia Display 98, pp. 1109-1112, 1998. 9.28-10.1).

Meanwhile, a storage capacitor for sustaining the voltage applied to a pixel is generally provided in the TFT array panel, and the storage capacitor includes a storage electrode and a portion of a pixel electrode as well as a passivation layer interposed therebetween. The storage electrode is made of the same layer as a gate wire, and the portion of the pixel electrode is formed on the passivation layer. The storage electrode is covered with a gate insulating layer, a semiconductor layer and a passivation layer, and most portion of the pixel electrode is formed directly on the substrate in Han et al. Therefore, the pixel electrode should step up the triple layers of the gate insulating layer, the semiconductor layer and the passivation layer, in order to overlap the storage electrode. It may cause a disconnection of the pixel electrode near the high step-up area.

In the meantime, as shown in '189, the conventional photolithography process uses a photoresist (PR) layer. The conventional photoresist layer is exposed to light through a photomask and divided into two sections, one exposed to the light and the other not exposed. The development of the photoresist layer forms the PR pattern having a uniform thickness with the PR layer exposed to the light removed. Accordingly, the etched thickness of the layers under the PR pattern is also uniform. However, Han et al. uses a photomask having a grid, which lowers the amount of light reaching the portion of a positive PR layer thereunder, to form a PR pattern having thinner portions than the other portions. The different thickness of the PR pattern produces the different etching depth of the underlying layers.

Therefore, Han et al. has a problem in forming the grid throughout a wide region, and it is hard to make the etching depth uniform under the grid region, even though the grid is formed throughout the wide region.

U.S. Pat. Nos. 4,231,811, 5,618,643, and 4,415,262 and Japanese patent publication No. 61-181130, etc., which disclose similar methods as Han et al., have the same problem.

SUMMARY OF THE INVENTION

It is therefore an object of the present invention to suggest a novel method for manufacturing thin films using photolithography.

It is another object of the present invention to simplify the manufacturing method of a TFT array panel for an LCD, thereby reducing the manufacturing cost and increasing the productivity.

It is another object of, the present invention to etch thin films to a different uniform depths depending on the position, at the same time.

These and other objects are provided, according to the present invention, by forming a contact hole for a gate pad along with at least one other layer.

According to the present invention, a gate wire including a plurality of gate lines, gate electrodes and gate pads, is formed on a substrate having a display area and a peripheral area. A gate insulating layer pattern is formed thereon. A semiconductor pattern is formed on the gate insulating layer, and a ohmic contact pattern is formed on the semiconductor pattern. Then, a data wire including data lines, source and drain electrodes located on the display area, and data pads located on the peripheral area is formed thereon. A passivation layer for channel is formed and a plurality of pixel electrodes connected to the drain electrodes are formed. At this time, the gate insulating layer pattern is formed along with at least one other layer through a photolithography process using a photoresist pattern of which thickness is varying according to location.

It is preferable that the photoresist pattern has a first portion located at the position corresponding to the gate pad, a second portion which is thicker than the first portion and located in the display area, and a third portion which is thicker than the second portion.

The photoresist pattern is formed on the passivation layer. The gate insulating layer pattern, the semiconductor layer pattern and the passivation layer pattern are formed by etching the passivation layer and the semiconductor layer under the first portion of the photoresist pattern, and the second portion of the photoresist pattern at the same time. Then, the second portion of the photoresist pattern to expose the passivation layer thereunder is removed by an ashing process, etching the passivation layer and the gate insulating layer to expose the semiconductor layer under the first portion and to form a first contact hole exposing the gate pad under the first portion by using the photoresist pattern as an etch mask, and removing the semiconductor layer under the second portion by using the photoresist pattern as an etch mask.

At this time, a second contact hole exposing the data pad may be formed in the step of etching passivation layer and the semiconductor layer under the first portion or forming the first contact hole. A third contact hole exposing the drain electrode may be formed in the step of forming the first contact hole or etching the passivation layer and the semiconductor layer under the first portion. The etching step of the passivation layer and the semiconductor layer may be performed by a dry etch of using $SF_6+O_2$ or $SF_6+HCl$ as an etch gas, and the ashing process may be performed by using $N_2+O_2$ or $O_2+Ar$ gas. The semiconductor layer may be made of amorphous silicon, and the first contact hole may be formed by using one of such gases as $SF_6+O_2$, $SF_6+N_2$, $CF_4+O_2$ and $CF_4+CHF_3+O_2$, which have a high etch selectivity between the passivation layer and the semiconductor layer. The semiconductor layer may be removed by a dry etch using $Cl_6+O_2$ or $SF_6+HCl+Ar+O_2$ as an etch gas. A redundant gate pad and a redundant data pad respectively covering the gate pad and the data pad is formed while forming the pixel electrode.

A gate wire, including gate lines, gate electrodes and gate pads, is formed on a substrate. A gate insulating layer pattern covering the gate wire except for at least a part of the gate pad, a semiconductor layer pattern, a ohmic contact layer pattern are formed on the gate wire. A data wire, including data lines, source and drain electrodes and data pads, is formed on the ohmic contact layer pattern. A passivation layer pattern and pixel electrodes are formed thereon. At this time, the gate insulating layer pattern is formed along with at least one of such patterns as the semiconductor pattern, the ohmic contact layer pattern, the data wire, the passivation layer pattern and the pixel electrode through a photolithography process. The photolithography process comprises the steps of coating a photoresist layer, exposing the photoresist layer through a photomask having a first part, a second part and a third part of which transmittance are different from each other and developing the photoresist layer to form a photoresist pattern. The exposing step may be done by using two kinds of photomask. The first photomask has a first part and a second part having a higher transmittance than that of the first part, and the second photomask has a third part of which transmittance is higher than that of the first part but lower than that of the second part and a fourth part of which transmittance is the same as that of the first part. At this time, the transmittance of the second part of the photomask is 20% to 60% of that of the first part and the transmittance of the third part is lower than 3%. The photomask having a substrate and at least one mask layer, and the difference of transmittance between the first part and the second part is made by using materials having different transmittance or differentiating the thickness of the mask layer. The difference of transmittance may be made by forming slits or a grid pattern smaller than the resolution of the stepper.

According to the present invention, a new photolithography method of thin films is provided.

In concrete, at least a thin film is formed on a substrate and a photoresist layer is coated on the thin film. The photoresist layer is exposed to a light through at least a photomask having more than three part of which transmittance are different from each other, and developed to form a photoresist pattern of which thickness is varying according to the location. The thin film is etched along with the photoresist pattern.

A dry etching method and the positive photoresist layer are preferred.

At least a thin film is formed on a substrate, and a photoresist pattern which has a first portion, a second portion of which thickness is thicker than that of the first portion and a third portion of which thickness is thicker than that of the second portion is formed on the thin film. The portion of the thin film under the first portion is etched along with the first portion but the second and the third portion protect the portions of the thin film under them. The photoresist pattern is stripped to expose the thin film under the second portion but leave the third portion to a certain thickness. The exposed portion of the thin film is etched but the third portion protects the portion of the thin film thereunder.

It is preferable that the stripping step of photoresist pattern is performed by an ashing process.

Another manufacturing method of a thin film transistor array panel is provided.

In concrete, a gate wire including a plurality of gate lines, gate electrodes and gate pads is formed on an insulating substrate. A gate insulating layer, a semiconductor layer, an ohmic contact layer and a conductor layer are sequentially deposited on the gate wire. The conductor layer and the ohmic contact layer is patterned by photolithography to form a data wire including a plurality of data lines, source electrodes, drain electrodes and data pads, and an ohmic contact layer pattern thereunder. A passivation layer is deposited and a photoresist layer is coated on the passivation layer. A photoresist pattern of which thickness is varying according to the location is formed by exposure and development. The passivation layer, the semiconductor layer and the gate insulating layer are etched along with the photoresist pattern to form a passivation layer pattern, a semiconductor layer pattern, and a gate insulating layer pattern having contact holes exposing the gate pads and a none-zero thickness in the display area, and a plurality of pixel electrodes respectively connected to the drain electrodes is formed on the passivation layer.

At this time, a plurality of redundant gate pads and redundant data pads respectively covering the gate pads and the data pads may be formed in the forming step of the pixel electrodes.

A first metal layer is deposited on a substrate and a gate wire including a plurality of gate lines and gate pads is formed by a first photolithography process. A first insulating layer, a semiconductor layer, an ohmic contact layer and a second metal layer is deposited on the gate wire. The second metal layer and the ohmic contact layer are patterned to form a data wire including a plurality of data lines, data pads, source electrodes and drain electrodes, and an ohmic contact layer pattern thereunder by a second photolithography process. A second insulating layer is deposited. The second insulating layer, the semiconductor layer and the first insulating layer is patterned to form a passivation layer pattern that covers the gate wire, the data wire and the portions of the semiconductor between the source electrode and the drain electrode and exposes a portion of the drain electrodes and the data pads, a semiconductor layer pattern having separated portion at least on the gate wire, and a gate insulating layer pattern exposing the gate pad by a third photolithography process. A transparent conductor layer is deposited and patterned to form a plurality of pixel electrodes connected to the drain electrode, redundant gate pads and redundant data pads respectively covering the gate pads and the data pads.

At this time, the third photolithography process may comprise the steps of coating a photoresist layer on the second insulating layer and exposing the photoresist layer by using a photomask having at least two portions, of which transmittance are different from each other. The third photolithography process may comprise a development step after the exposure to form a photoresist pattern having at least three different heights. The third photolithography process may comprise etching step of the photoresist pattern, the second insulating layer, the semiconductor layer and the first insulating layer to remove the first portion which is the lowest portion, and the second insulating layer, the semiconductor layer and the first insulating layer thereunder to expose the gate pads, and to remove the second portion which is higher than the first portion, and the second insulating layer and the semiconductor layer thereunder, but not remove the second insulating layer under the third portion which is higher than the second portion. The etching step of the photoresist pattern, the second insulating layer, the semiconductor layer and the first insulating layer comprises the steps of etching the second insulating layer, the semiconductor layer and the first insulating layer under the first portion of the photoresist pattern by using the second and the third portion as an etch stopper, removing the second portion of the photoresist layer to expose the second insulating layer thereunder by ashing process, and etching the exposed portion of the second insulating layer and the semiconductor layer thereunder by using the third portion of the photoresist layer as an etch stopper. The ashing process is performed by using oxygen.

The transmittance difference of the photomask may be controlled by differentiating the thickness of a mask layer. The photomask may be classified into a first mask for the gate pad and a second mask for elsewhere, and the transmittance of the first mask is different from that of the second mask. The pixel electrodes may be formed just on the first insulating layer extended from under the data wire or under the drain electrode. The semiconductor layer may be made of amorphous silicon. The ohmic contact layer may be made of amorphous silicon doped with phosphorus. The transparent conductor layer may be made of indium-tin-oxide.

A TFT array panel having structure as following is manufactured by the method described above.

A gate wire including a plurality of gate lines, gate electrodes and gate pads is formed on a insulating substrate, and a gate insulating layer having contact holes exposing the gate pads is formed on the gate wire. A semiconductor layer pattern is formed on the gate insulating layer, and an ohmic contact layer pattern is formed on the semiconductor layer pattern. A data wire having a layout substantially the same as that of the ohmic contact layer pattern and including a plurality of source electrodes, drain electrodes, data lines and data pads is formed on the ohmic contact layer pattern. A passivation layer pattern having contact holes exposing the gate pad, the data pad and the drain electrode and having a layout substantially the same as that of the semiconductor layer pattern except for the portions of the drain electrode and the data pad is formed on the data wire and has wider layout. A transparent electrode layer pattern is electrically connected to the exposed gate pad, data pad and drain electrode.

At this time, at least one portion of the transparent electrode pattern may contact with the gate insulation layer extending from under the drain electrode. A portion of the semiconductor layer pattern and the ohmic contact layer pattern may be formed on the gate line, a storage electrode may be formed on the ohmic contact layer pattern located on the gate line, and the storage electrode may be electrically connected to the transparent electrode pattern. The shape of the gate insulating layer may be different from that of the passivation layer pattern in a part where the transparent electrode pattern is formed.

DETAILED DESCRIPTION OF THE PREFERRED EMBODIMENTS

Figure 1:
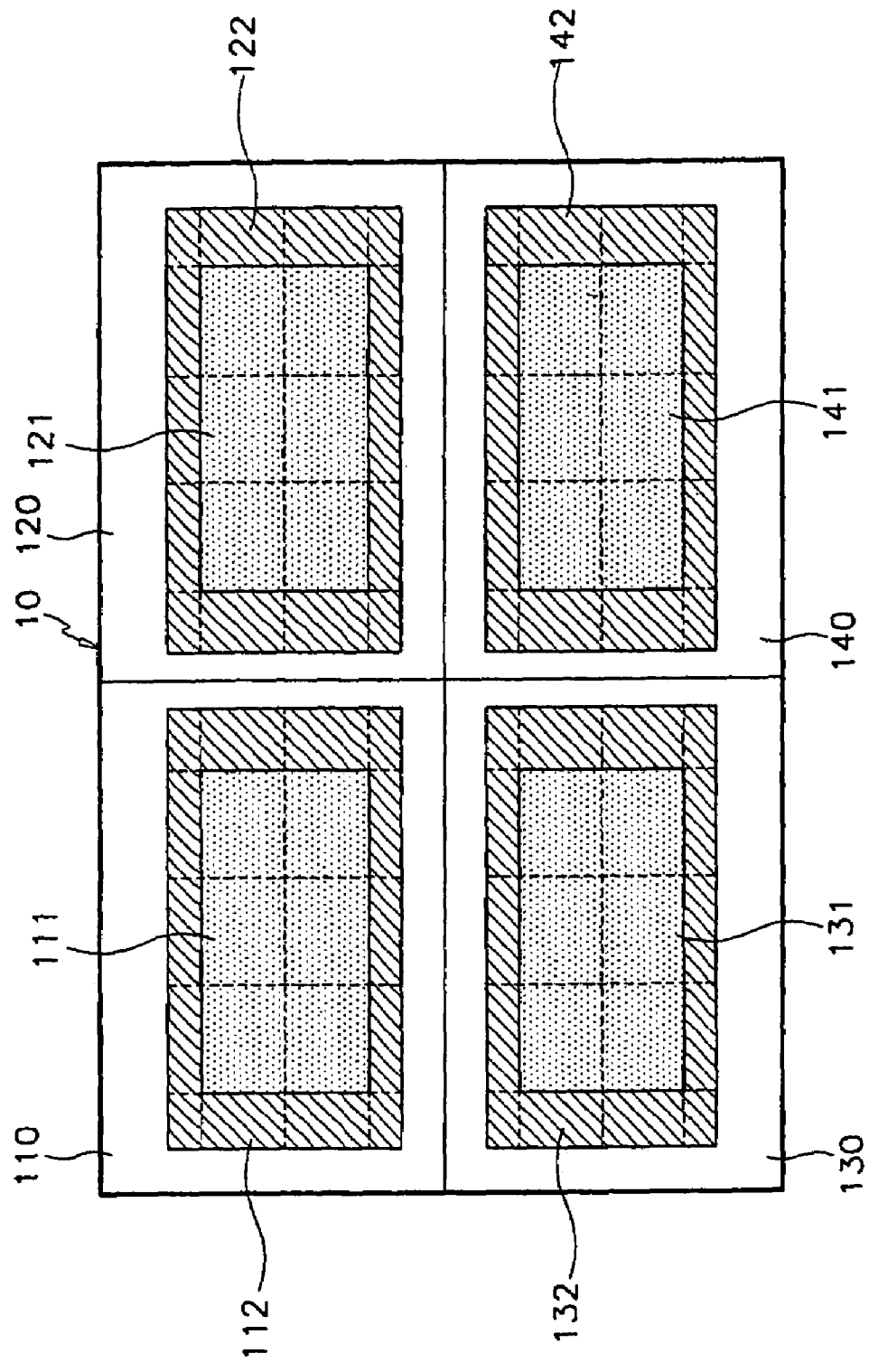
FIG. 1 is a schematic diagram of a substrate including four TFT array panels for LCDs according to an embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

In the embodiments of present invention, at least two layers are patterned at a time to form contact holes exposing gate pads.

Now, a structure of a TFT array panel according to an embodiment of the present invention will be described with reference to FIGS. 1 to 5.

As shown in FIG. 1, a plurality of panel areas are formed on an insulating plate 10. For example, as shown in FIG. 1, four panel areas 110, 120, 130 and 140 are formed on a glass plate 10. When the panels are TFT array panels, the panel areas 110, 120, 130 and 140 include display areas 111, 121, 131 and 141 having a plurality of pixels and peripheral areas 112, 122, 132 and 142, respectively. TFTs, wires and pixel electrodes are repeatedly arranged in matrix in the display areas 111, 121, 131 and 141, and pads to be connected to external circuits and electrostatic discharge protection circuits are provided in the peripheral areas 112, 122, 132 and 142.

In general, the elements in the panel areas 110, 120, 130 and 140 are formed by photolithography using a stepper, a kind of exposure equipment. When using the stepper, the display areas 111, 121, 131 and 141 and the peripheral areas 112, 122, 132 and 142 are divided into several sections, and a PR layer coated on thin films on the plate 10 is exposed to light section by section through one or more masks. Then, the PR layer is developed, and the thin films under the PR layer is etched to form thin film patterns. A complete LCD panel is obtained by repeating the above described patterning step.

Figure 2:
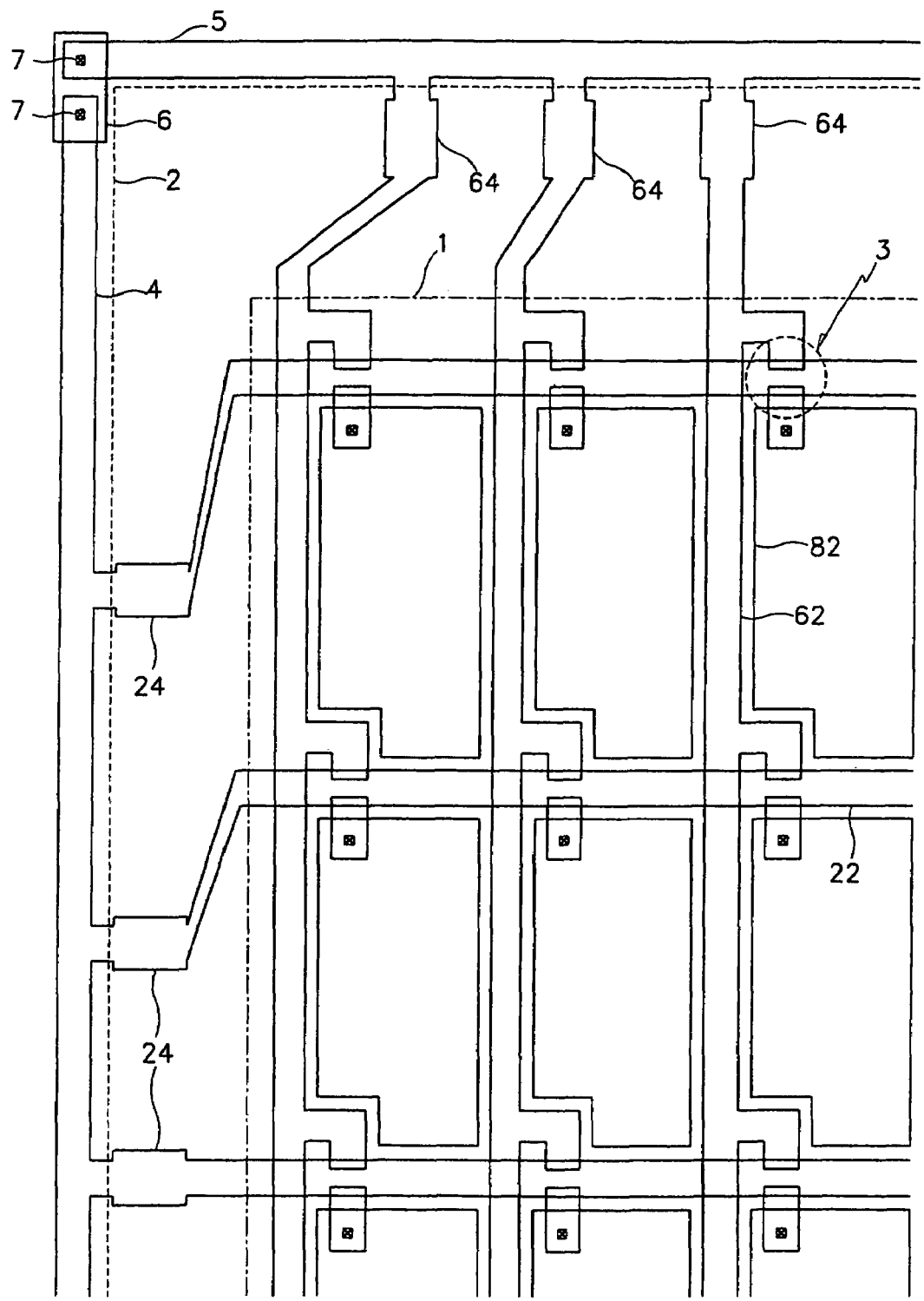
FIG. 2 is a layout view schematically showing a TFT array panel for an LCD according to an embodiment of the present invention.

FIG. 2 is a layout view of a TFT array panel area shown in FIG. 1 according to an embodiment of the present invention.

As shown in FIG. 2, a plurality of TFTs, a plurality of pixel electrodes electrically connected thereto and a plurality of wires including gate lines 22 and data lines 62 are formed in the display area surrounded by an imaginary line 1. Gate pads 24 and data pads 64 respectively connected to the gate lines 22 and the data lines 62, and a gate shorting bar 4 and a data shorting bar 5 are formed in the peripheral area. The gate shorting bar 4 and the data shorting bar 5 connect the whole gate lines 22 and the whole data lines 62, respectively, and are electrically connected to each other through a connector 6 to make them in the same potential, thereby protecting the device elements from electrostatic discharge failure. The shorting bars 4 and 5 will be removed by cutting the panel along the cutting line 2. A reference numeral 7 represents contact holes formed in insulating layers (not shown) interposed between the connector 6 and the shorting bars 4 and 5, and the connector 6 is connected to the shorting bars 4 and 5 through the contact holes 7.

Figure 3:
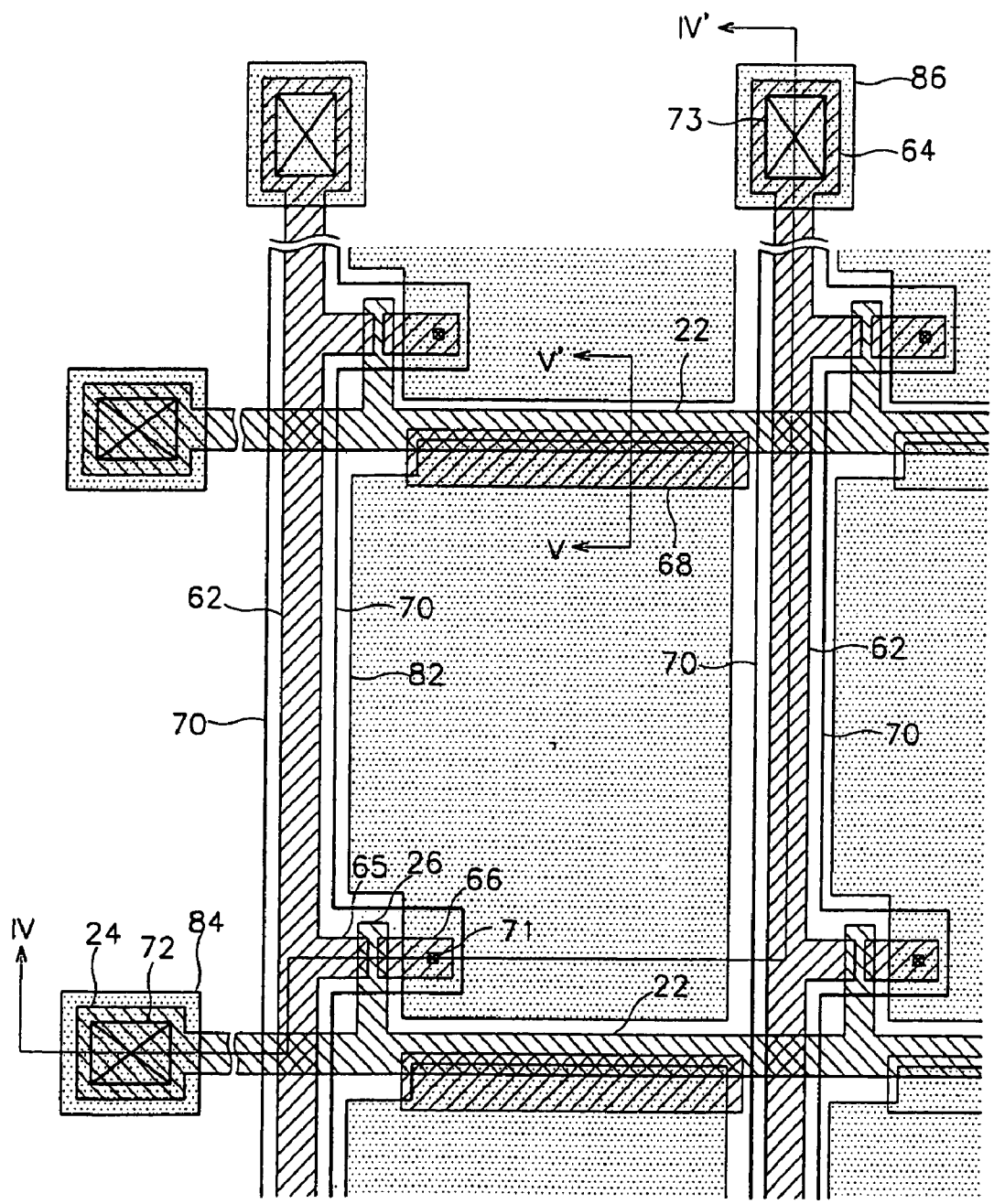
FIG. 3 is a layout view of a TFT array panel for an LCD according to a first embodiment of the present invention, showing an enlarged view of a pixel and pads in FIG. 2.
Figure 4:
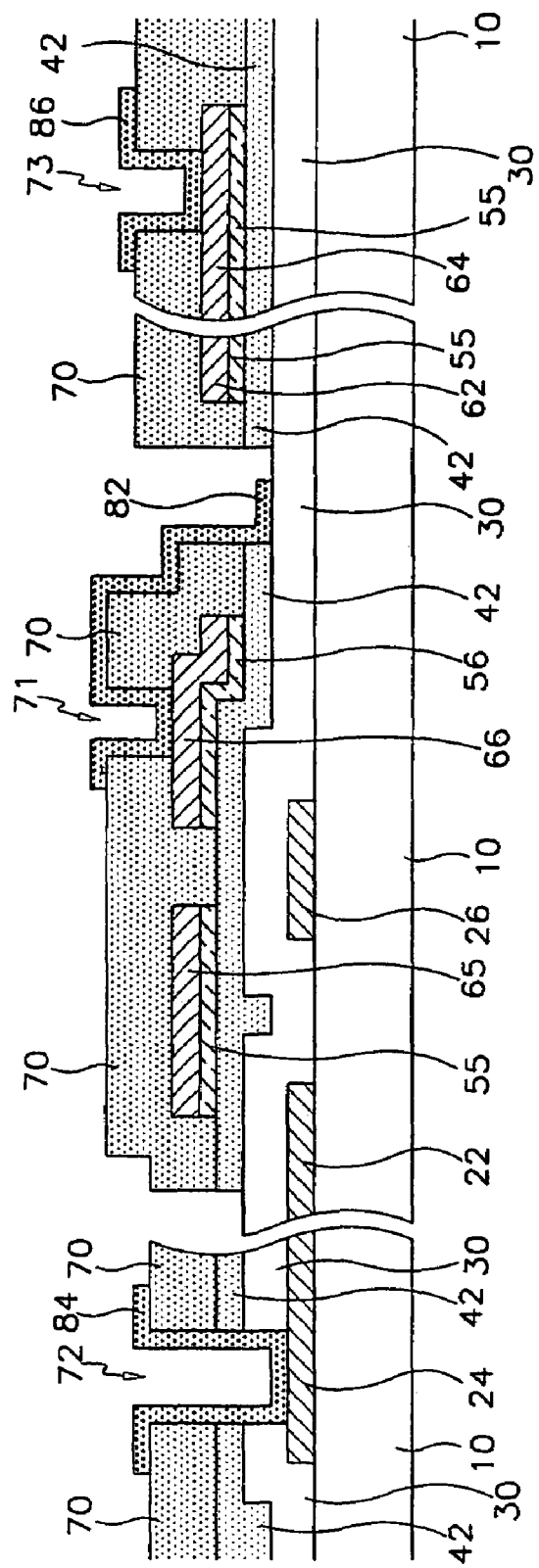
FIGS. 4 and 5 are cross-sectional views of the TFT array panels shown in FIG. 3 taken along the lines IV-IV' and V-V' in FIG. 3, respectively.
Figure 5:
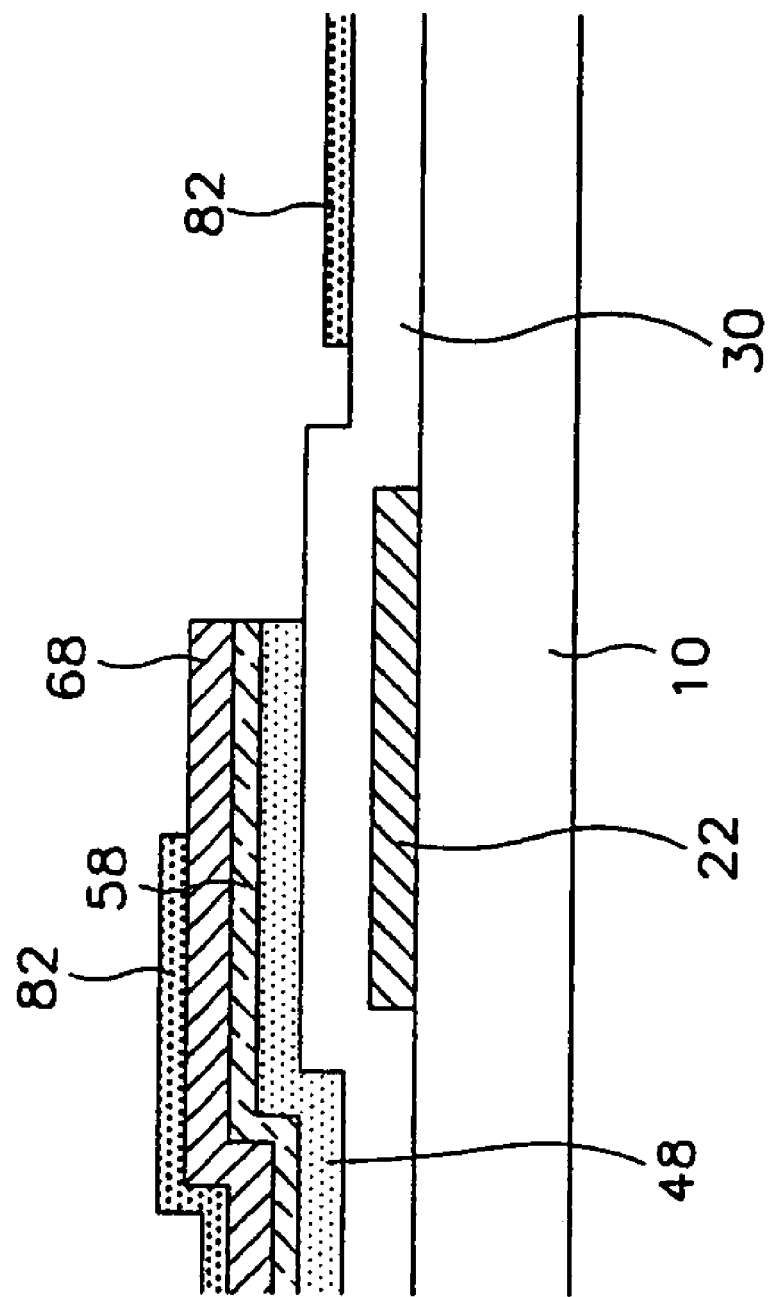

FIGS. 3 to 5 are an enlarged view of a TFT array panel shown in FIG. 2 according to an embodiment of the present invention. FIG. 3 is a layout view, and FIGS. 4 and 5 are cross-sectional views taken along the lines IV-IV' and V-V' in FIG. 3.

A gate wire of metal or conductive material such as aluminum (Al) or aluminum alloy, molybdenum (Mo) or molybdenum-tungsten (MoW) alloy, chromium (Cr) and tantalum (Ta) is formed on an insulating substrate 10. The gate wire includes a plurality of gate lines (scanning signal lines) 22 extending in the horizontal direction, a plurality of gate pads 24 connected to one ends of the respective gate lines 22 and transmitting the scanning signals from an external circuit to the gate lines 22, and a plurality of gate electrodes 26 of TFTs, which are branches of the gate lines 22.

The gate wire 22, 24 and 26 may have a multiple-layered structure as well as a single-layered structure. When the gate wire 22, 24 and 26 has the multiple-layered structure, it is preferable that one layer is made of a material having a low resistivity and another layer is made of a material having a good contact with other materials. The double layers of Cr/Al (or Al alloy) and Al/Mo are such examples.

A gate insulating layer 30 of such as silicon-nitride (SiNx) is formed on the gate wire 22, 24 and 26 to cover them.

A semiconductor pattern 42 and 48 made of semiconductor such as hydrogenated amorphous silicon is formed on the gate insulating layer 30. An ohmic contact layer pattern 55, 56 and 58 made of amorphous silicon heavily doped with impurities such as phosphorus is formed on the semiconductor pattern 42 and 48.

A data wire made of conductive material such as Mo or MoW, Cr, Al or Al alloy and Ta is formed on the ohmic contact layer pattern 55, 56 and 58. The data wire has a data line 62 extending in the vertical direction, a data pad 64 connected to an end of the data line 62 and transmitting image signals from an external circuit to the data line 62, and a source electrode 65 of a TFT that is a branch of the data line 62. The data wire also has a plurality of drain electrodes 66 of the TFrs, which are located opposite to the respective source electrodes with respect to the respective gate electrodes 22 and separated from other data wire elements 62, 64 and 65, and a conductor pattern for storage capacitors which includes a plurality of conductor islands 68. Each conductor island 68 is located over the gate line 22 and overlaps the same. The conductor island 68 is connected to a pixel electrode 82, which will be described later, to form a storage capacitor. However, if a sufficient storage capacitance can be achieved by the overlap of the pixel electrode 82 and the gate line 22, the conductor islands 68 may not be required.

The data wire 62, 64, 65, 66 and 68 may have a multiple-layered structure like the gate wire 22, 24, 26 and 28. Of course, when the data wire has a multiple-layered structure, it is preferable that one layer is made of a material having a low resistivity and another is made of a material having a good contact with other materials.

The ohmic contact layer patterns 55, 56 and 58 reduce the contact resistance between the semiconductor pattern 42 and 48 and the data wire 62, 64, 65, 66 and 68, and have substantially the same layout as the data wire 62, 64, 65, 66 and 68. In other words, the first ohmic contact layer portions 55 under the data wire elements 62, 64 and 65 have substantially the same shape as those of 62, 64 and 65, the second ohmic contact layer portions 56 under the drain electrodes 66 as the drain electrodes 66, and the third ohmic contact layer portions 58 under the conductor pattern 68 for the storage capacitors as the conductor pattern 68 for the storage capacitors.

The semiconductor pattern 42 and 48 has a similar layout to the data wire 62, 64, 65, 66 and 68 and the ohmic contact layer pattern 55, 56 and 57 except for the channels of the thin film transistors. In detail, first portions 48 of the semiconductor pattern, the conductor pattern 68 for the storage capacitors and the third ohmic contact layer portion 58 have the same shape, while second portions 42 of the semiconductor pattern have different shapes from the remaining portions of the data wire 62, 64 and 65 and the ohmic contact layer pattern 55, 56 and 57. The data wire elements 62, 64 and 65, especially the source electrode 65 and the drain electrode 66 are separated from each other on the channel of the thin film transistor, and the portions 55 and 56 of the ohmic contact layer pattern thereunder are also separated from each other, while the semiconductor portion 42 is not divided into two pieces so that it can make a channel of the thin film transistor. Meanwhile, the portions 42 of semiconductor pattern 42 extend to the peripheral area.

The data wire elements 62, 64 and 65, the drain electrode 66 and the semiconductor pattern 42 are covered with a passivation layer 70. The passivation layer 70 has contact holes 71 and 73 respectively exposing the drain electrodes 66 and the data pads 64, and contact holes 72 exposing the gate pads 24. The passivation layer 70 has wider width than the data wire, and covers the boundary lines of the data wire. The passivation layer 70 has a planar shape substantially the same as the semiconductor layer pattern 42 except for the portions on the drain electrode 66 and the data pad 64. The gate lines 22 are not covered with the passivation layer 70 except for the portions under the data line 62. The passivation layer 70 may be made of an insulating material such as SiNx or acrylic organic material, and covers to protect at least the channels of the TFTS.

A plurality of pixel electrodes are formed on the portions of the gate insulating layer 30 surrounded by the gate lines 22 and the data lines 62. At this time, the first insulating layer 30 is extended from under the data wire elements 62, 64 and 65 and the drain electrode 66, and covers the gate wire 22, 24 and 26 and the substrate 10. The pixel electrodes 82 are made of a transparent conductive material such as ITO (indium tin oxide). The pixel electrodes 82 are physically and electrically connected to the respective drain electrodes 66 through the contact holes 71, and receive the image signals from the drain electrode to generate electric fields along with an electrode (not shown) of the other panel of the LCD. The pixel electrode 82 extends to and is also physically and electrically connected to the conductor island 68, and makes a storage capacitor along with the gate line 22 thereunder.

A plurality of redundant gate pads 84 and a plurality of redundant data pads 86 are respectively formed on the gate pads 24 and the data pads 64 and connected to them through the contact holes 72 and 73. Since these redundant pads 84 and 86 protect the pads 24 and 64 and complement the contacts between the external circuitry and the pads 24 and 64, they are optional.

In this embodiment, a transparent ITO layer is used for the pixel electrode 82, but an opaque conductive material may be used in a reflective type LCD.

Now, a manufacturing method of a TFT array panel according to an embodiment of the present invention will be described with reference to FIGS. 6A to 13B as well as FIGS. 3 to 5.

Figure 6A:
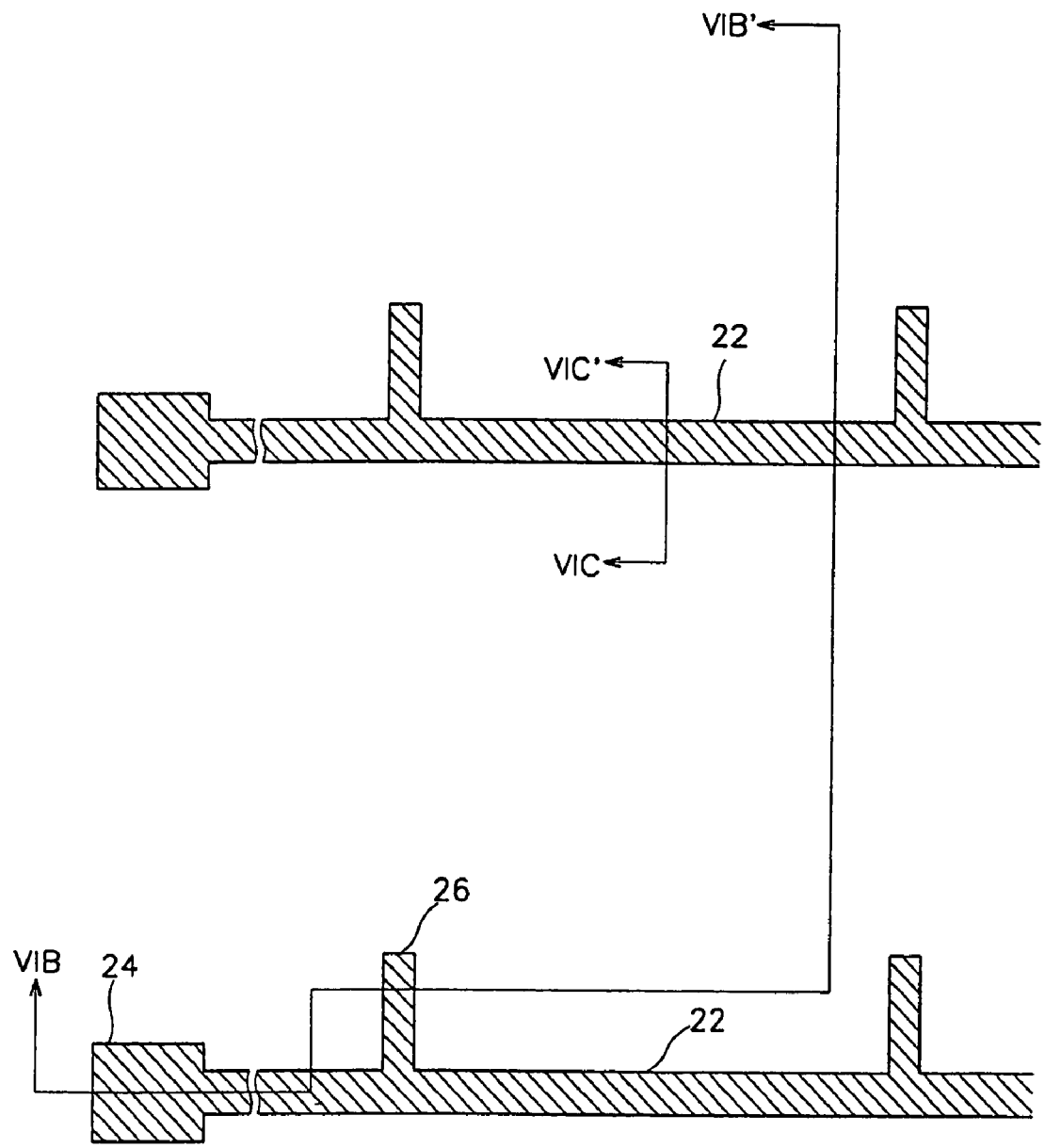
FIG. 6A is a layout view of a TFT array panel in the first manufacturing step of a manufacturing method of the LCD shown in FIGS. 3, 4 and 5 according to an embodiment of the present invention.
Figure 6B:
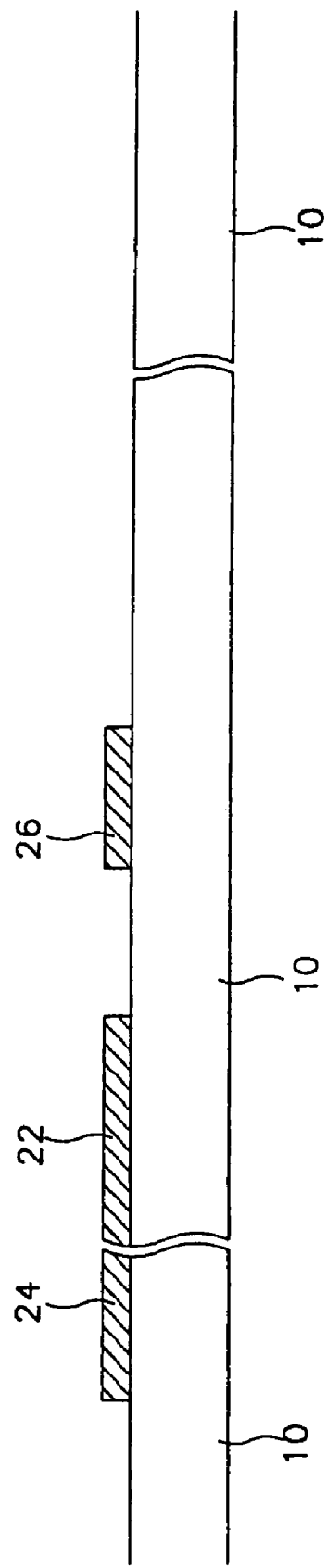
FIGS. 6B and 6C are respectively the cross-sectional views taken along the line VIB-VIB' and VIC-VIC' of FIG. 6A.
Figure 6C:
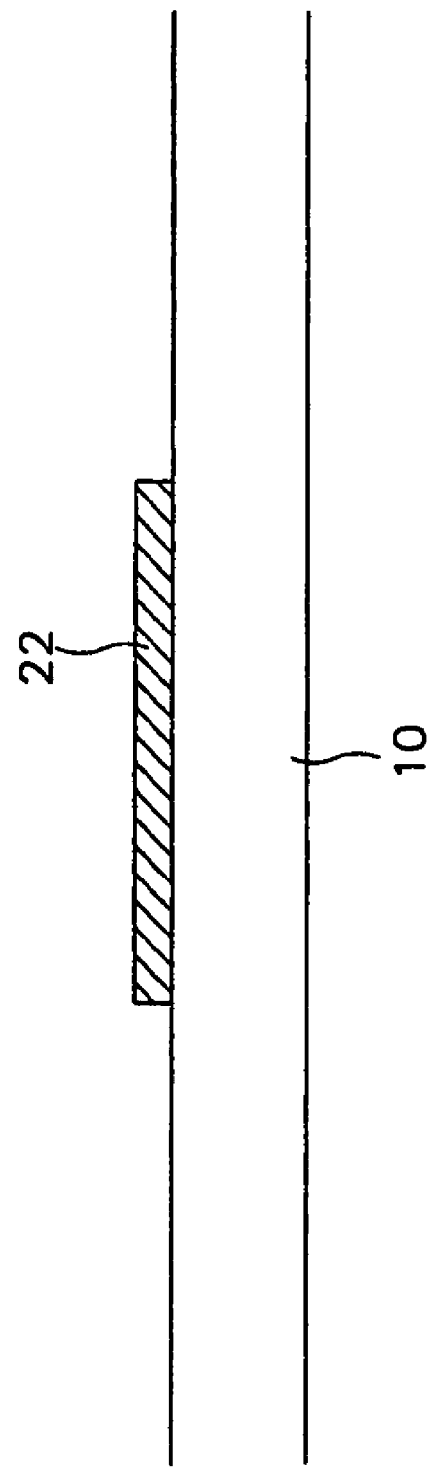

First, as shown in FIGS. 6A to 6C, a conductor layer of metal with the thickness of 1,000 Å to 3,000 Å is deposited on a substrate 10 by sputtering, and a gate wire including a plurality of gate lines 22, gate pads 24 and gate electrodes 26 are formed by dry or wet etch using a first photolithography step.

Figure 7A:
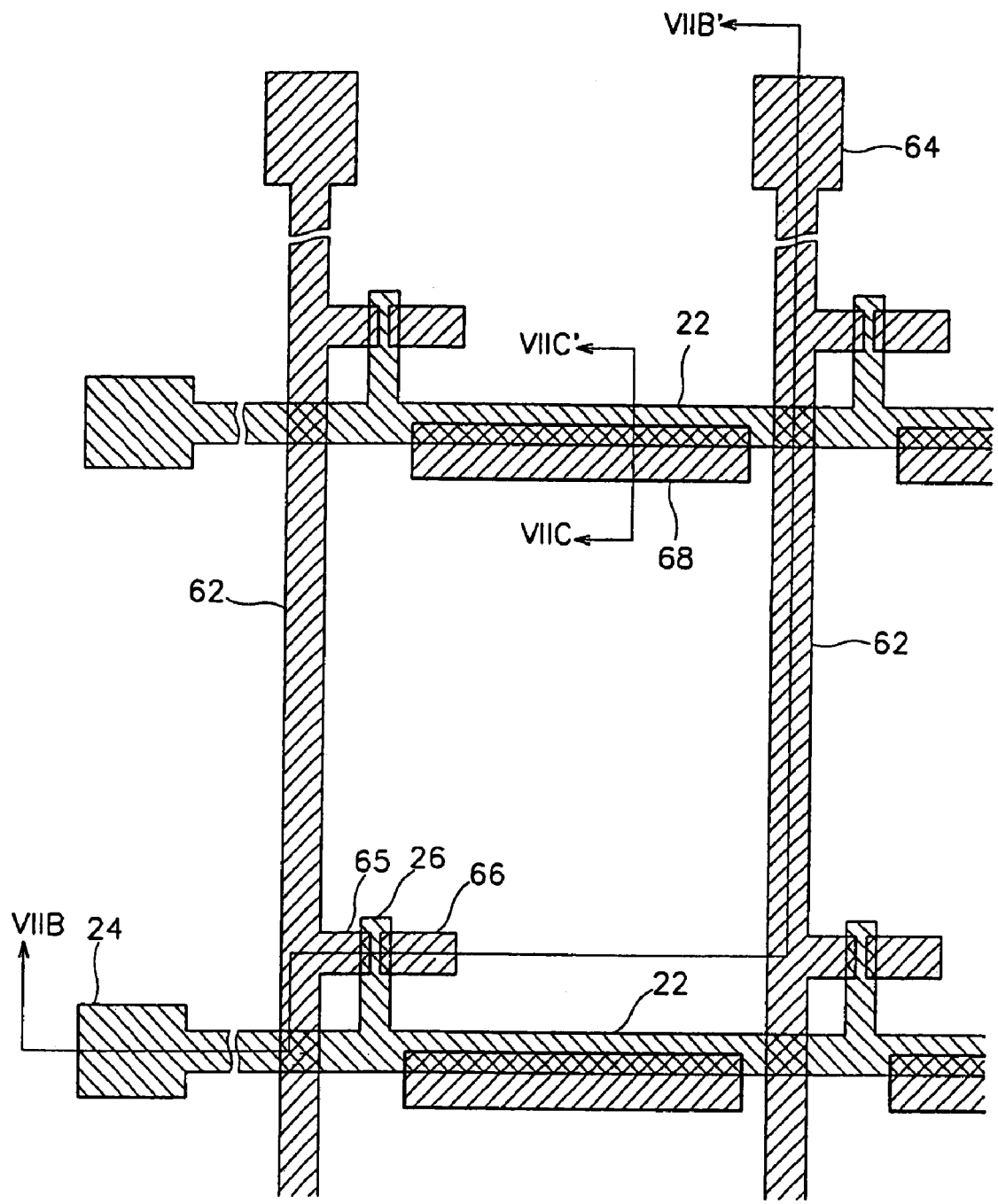
FIG. 7A is a layout view of a TFT array panel in a manufacturing step following FIGS. 6A to 6C.
Figure 7B:
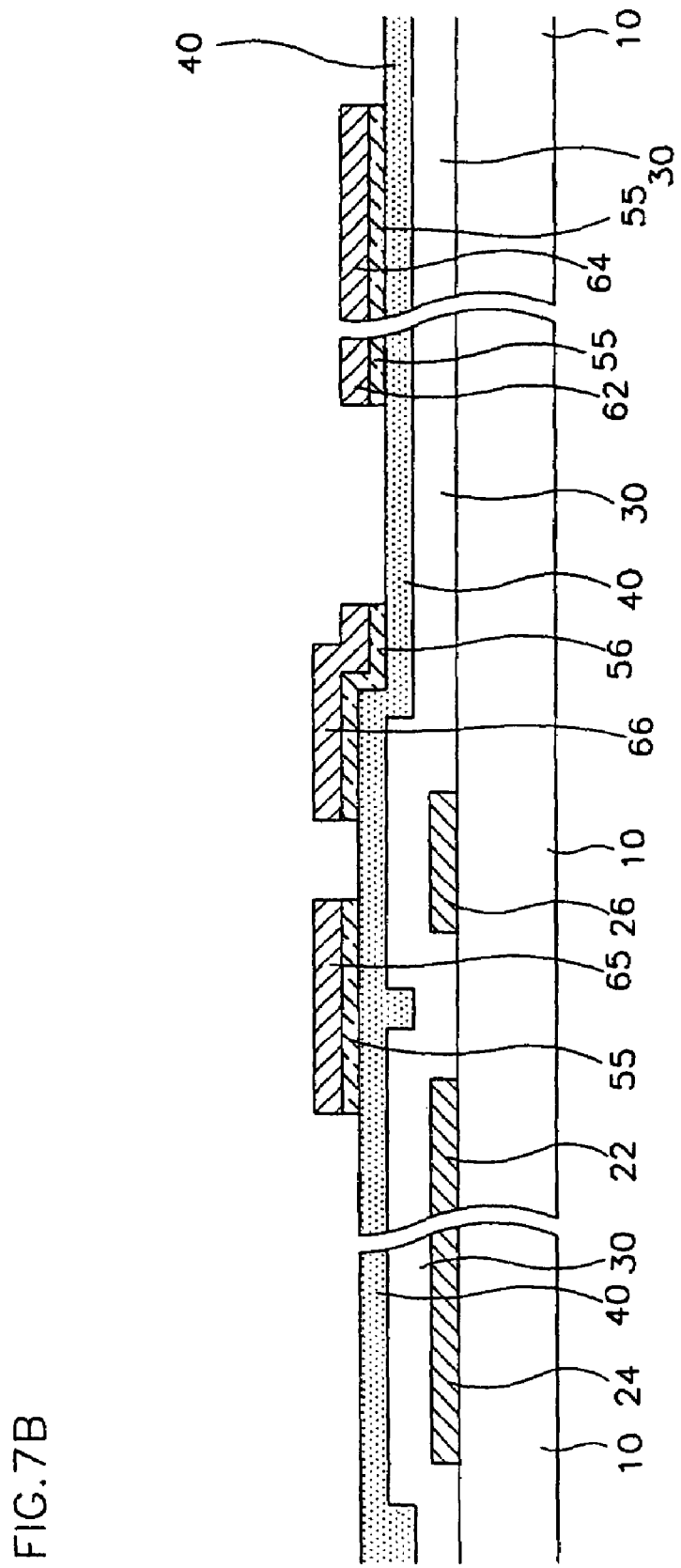
FIGS. 7B and 7C are respectively the cross-sectional views taken along the line VIIB-VIIB' and VIIC-VIIC' of FIG. 7A.
Figure 7C:
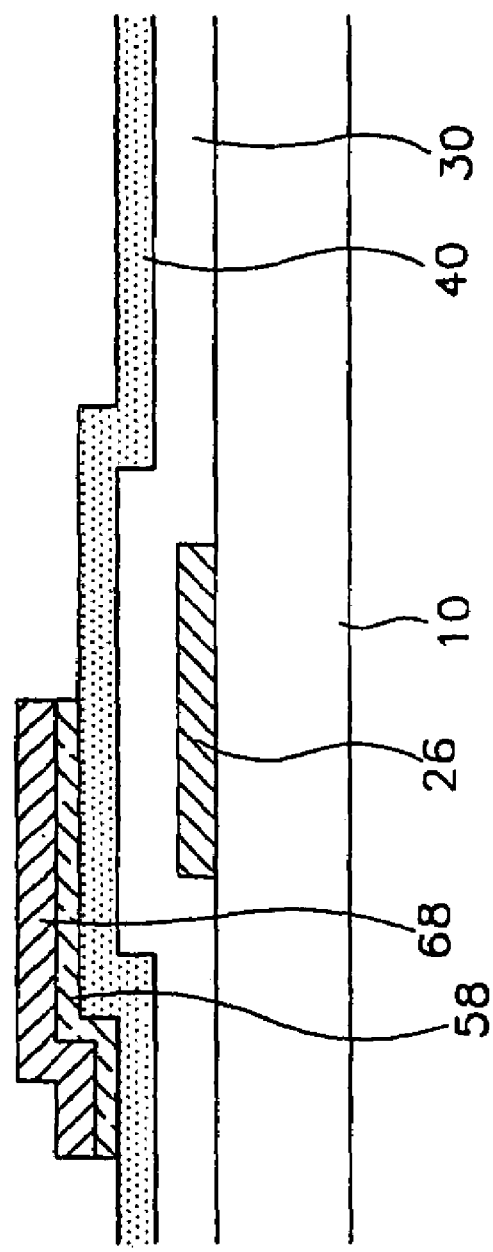

Next, as shown in FIGS. 7A and 7B, a gate insulating layer 30, a semiconductor layer 40 and an ohmic contact layer 50 with the respective thickness of 1,500 Å to 5,000 Å, 500 Å to 2,000 Å and 300 Å to 600 Å are sequentially deposited by such a method as chemical vapor deposition (CVD). Then, a conductor layer 60 of metal with the thickness of 1,500 Å to 3,000 Å is deposited by such a method as sputtering. The conductor layer 60 and the ohmic contact layer 50 thereunder are patterned to form data wire elements including data lines 62, data pads 64 and source electrodes 65, and first portions 55 of the ohmic contact layer 50 thereunder, drain electrodes 66 and second portions 56 of the ohmic contact layer pattern thereunder, and a conductor pattern 68 for storage capacitance and third portions 58 of the ohmic contact layer pattern thereunder by a second photolithography step.

Figure 8A:
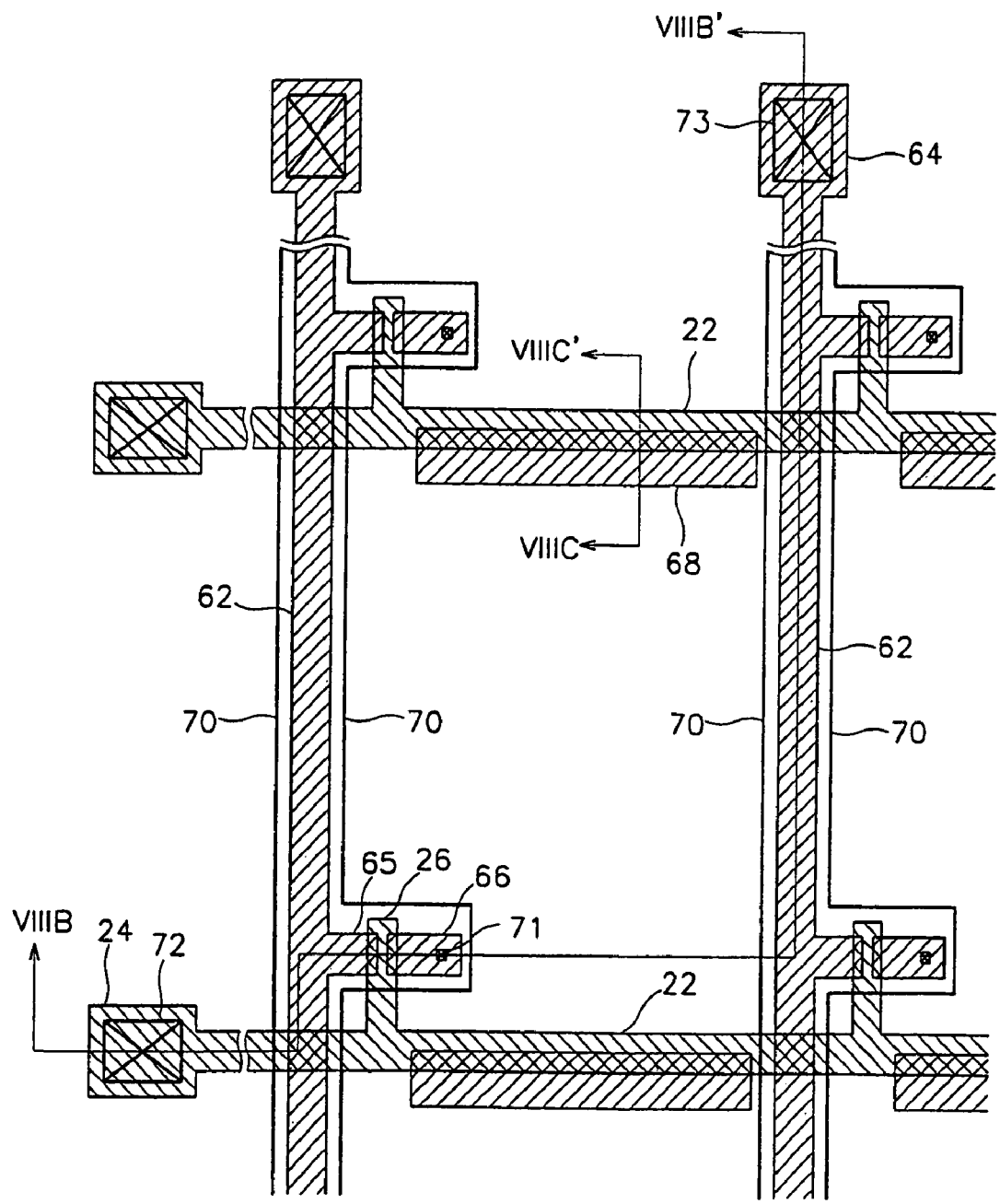
FIG. 8A is a layout view of a TFT array panel in a manufacturing step following FIGS. 7A to 7C.
Figure 12A:
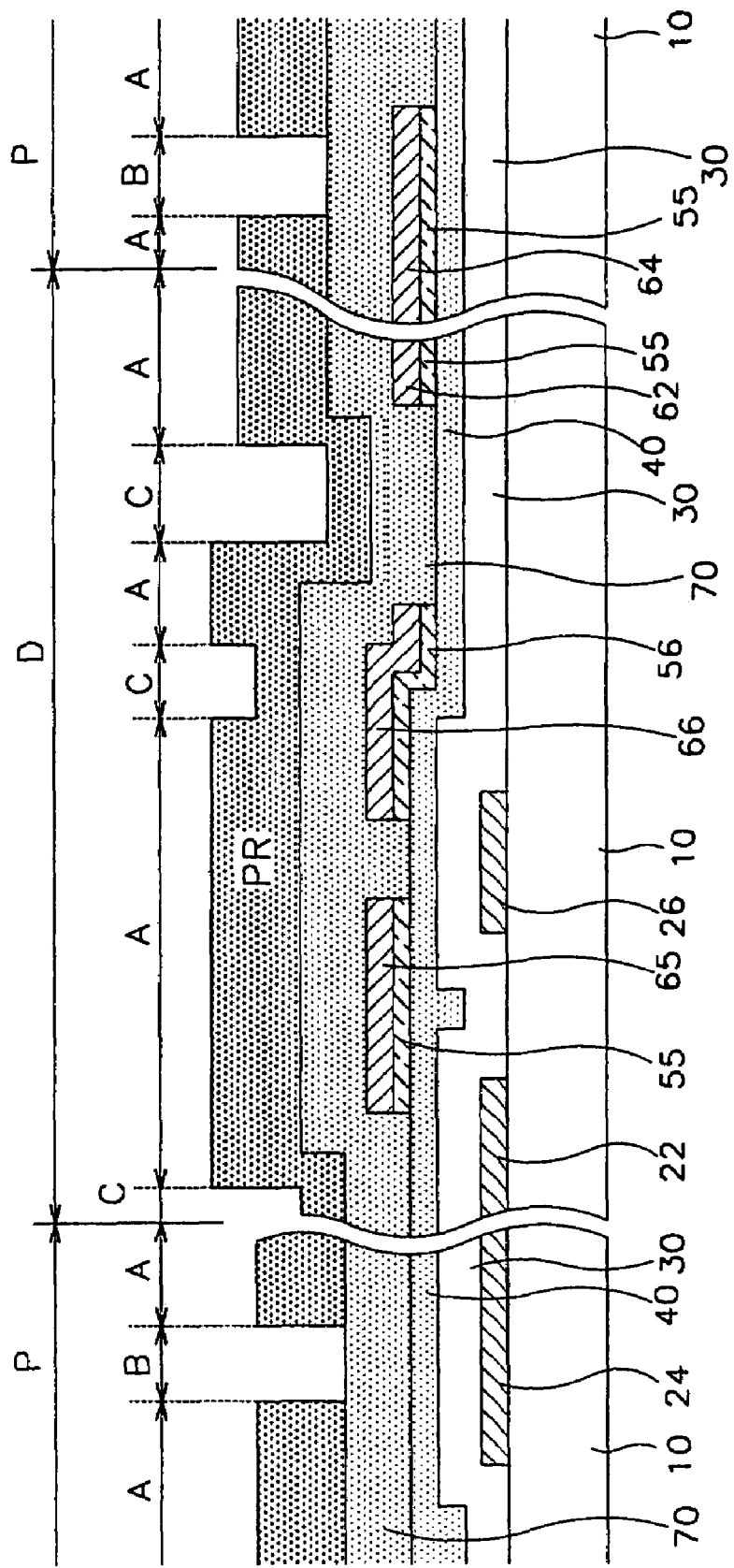
FIGS. 12A and 12B are respectively the cross-sectional views taken along the line VIIIB-VIIIB' and VIIC-VIIC' of FIG. 8A in the manufacturing step following FIGS. 8B and 8C.
Figure 12B:
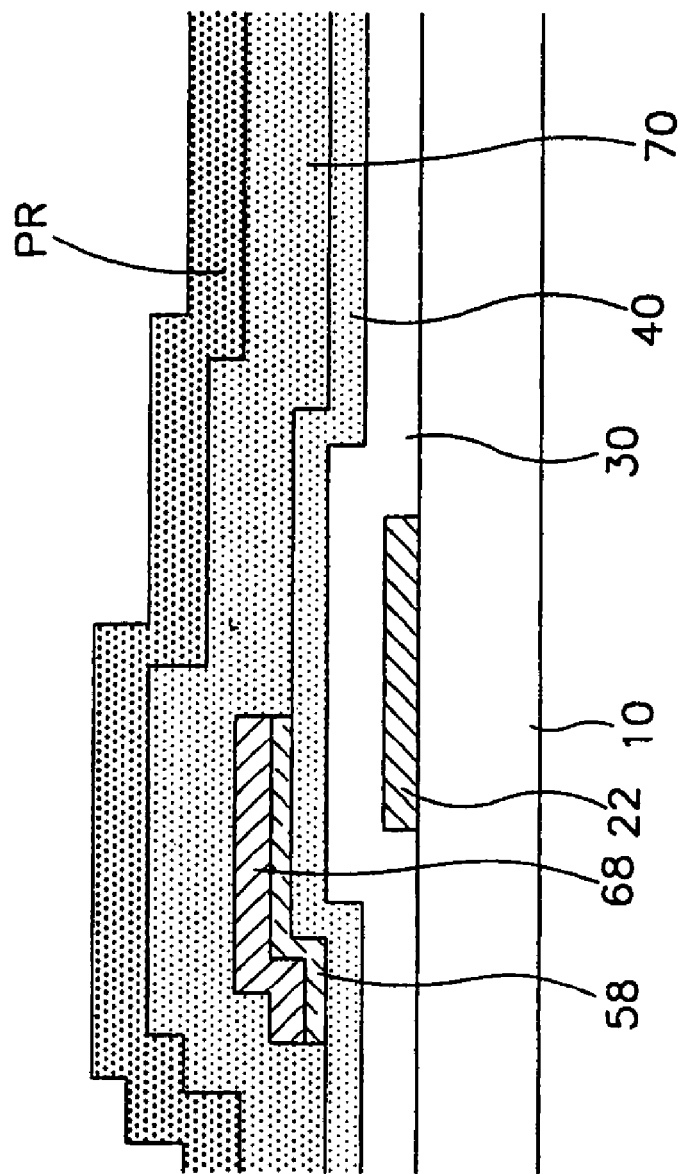
Figure 13A:
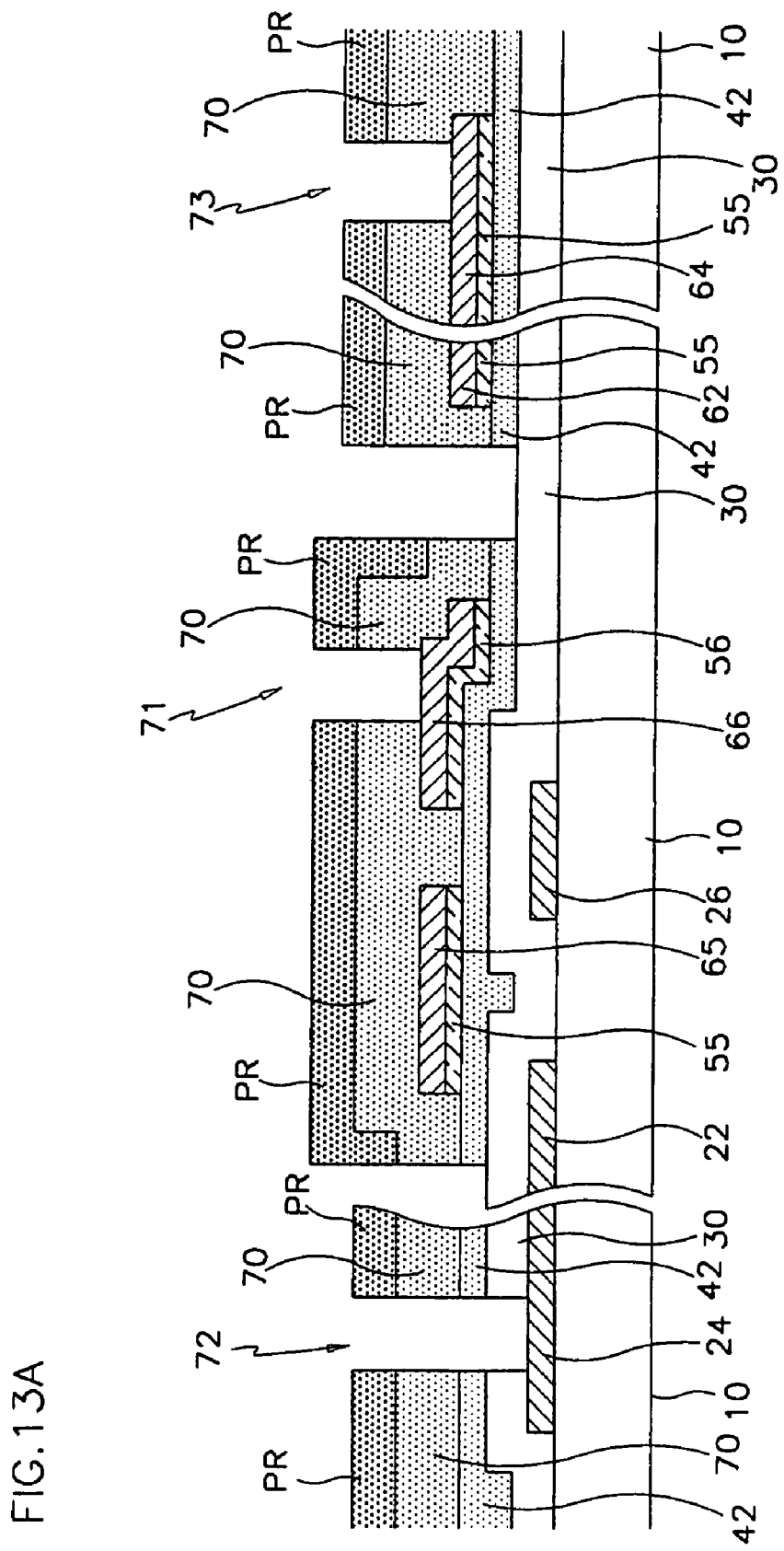
FIGS. 13A and 13B are respectively the cross-sectional views taken along the line VIIIB-VIIIB' and VIIIC-VIIIC' of FIG. 8A in the manufacturing step following FIGS. 12B and 12C.
Figure 13B:
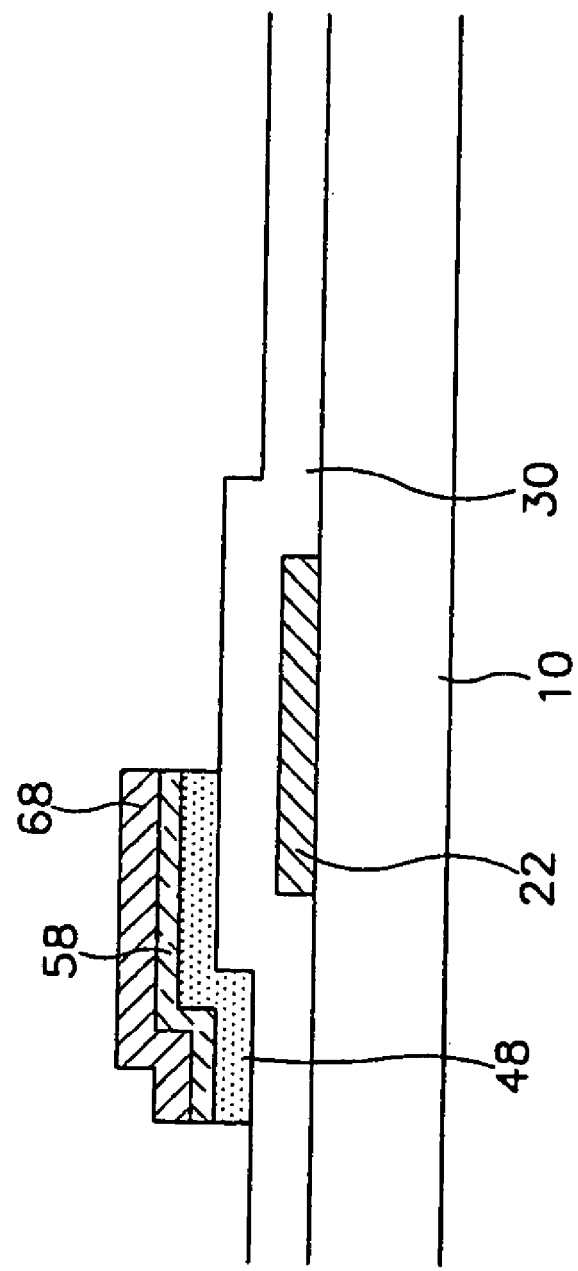

As shown in FIGS. 8A, 13A and 13B, a passivation layer 70 with a thickness over 3,000 Å A is deposited by CVD of SiNx or spin coated using organic insulator. Then, the passivation layer 70, the semiconductor layer 40 and the gate insulating layer 30 are patterned to form their patterns having contact holes 71, 72 and 73 by a third photolithography step. At this time, the portions of the passivation layer 70, the semiconductor layer 40 and the gate insulating layer 30 in the peripheral area P are removed (and the portions of the passivation layer 70 on the data pads 64 are also removed). However, in the display area only the portions of the passivation layer 70 and the semiconductor layer 40 is removed (and the portions of the passivation layer 70 on the drain electrodes 66 are also removed) to form a semiconductor pattern. For this purpose, a photoresist (PR) pattern is formed to have thickness that varies depending on the location, and the layers under the PR pattern are dry etched by using the PR pattern as an etch mask. It will be described with reference to FIGS. 8B to 12A.

Figure 8B:
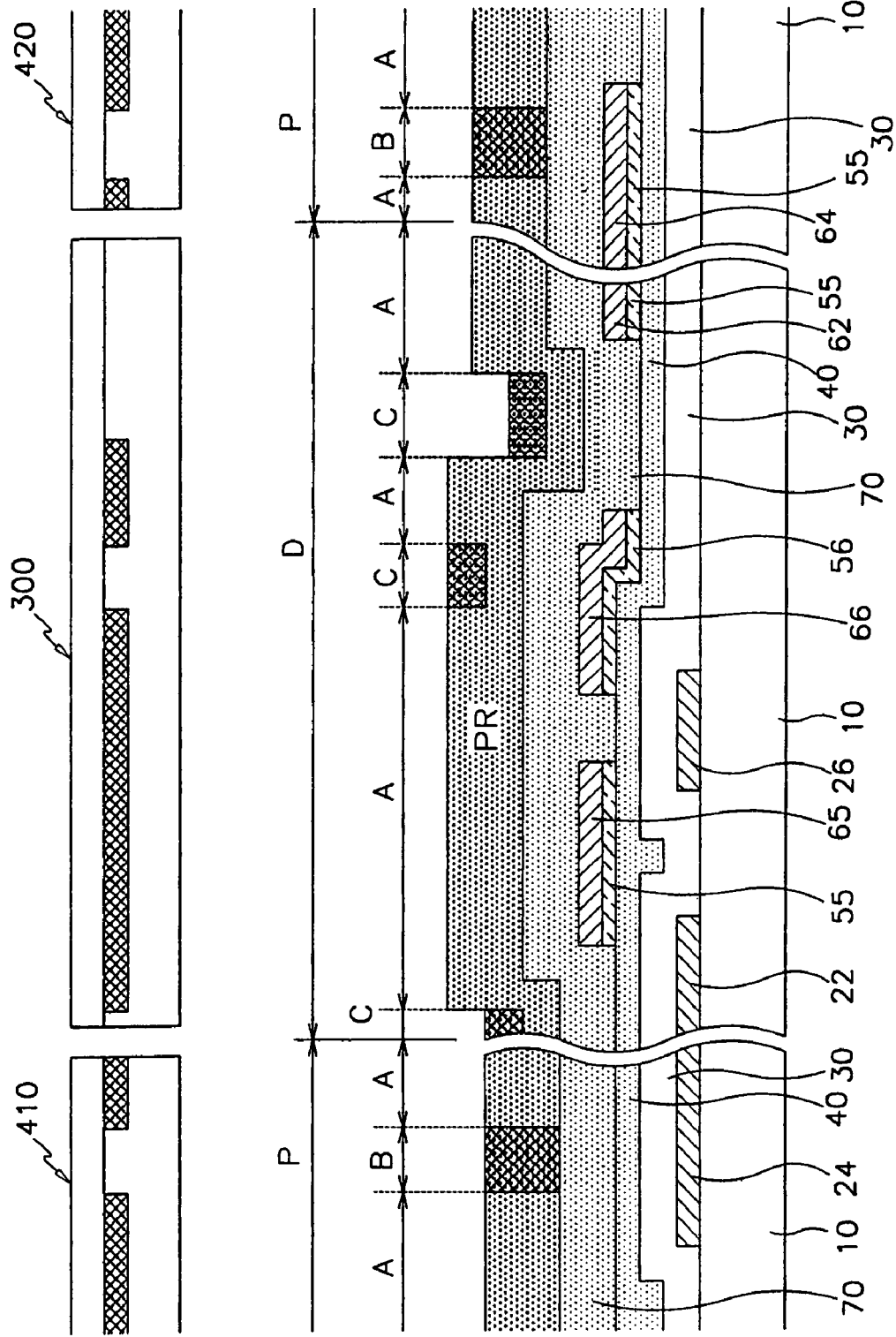
FIGS. 8B and 8C are respectively the cross-sectional views taken along the line VIIIB-VIIIB' and VIIIC-VIIIC' of FIG. 8A.
Figure 8C:
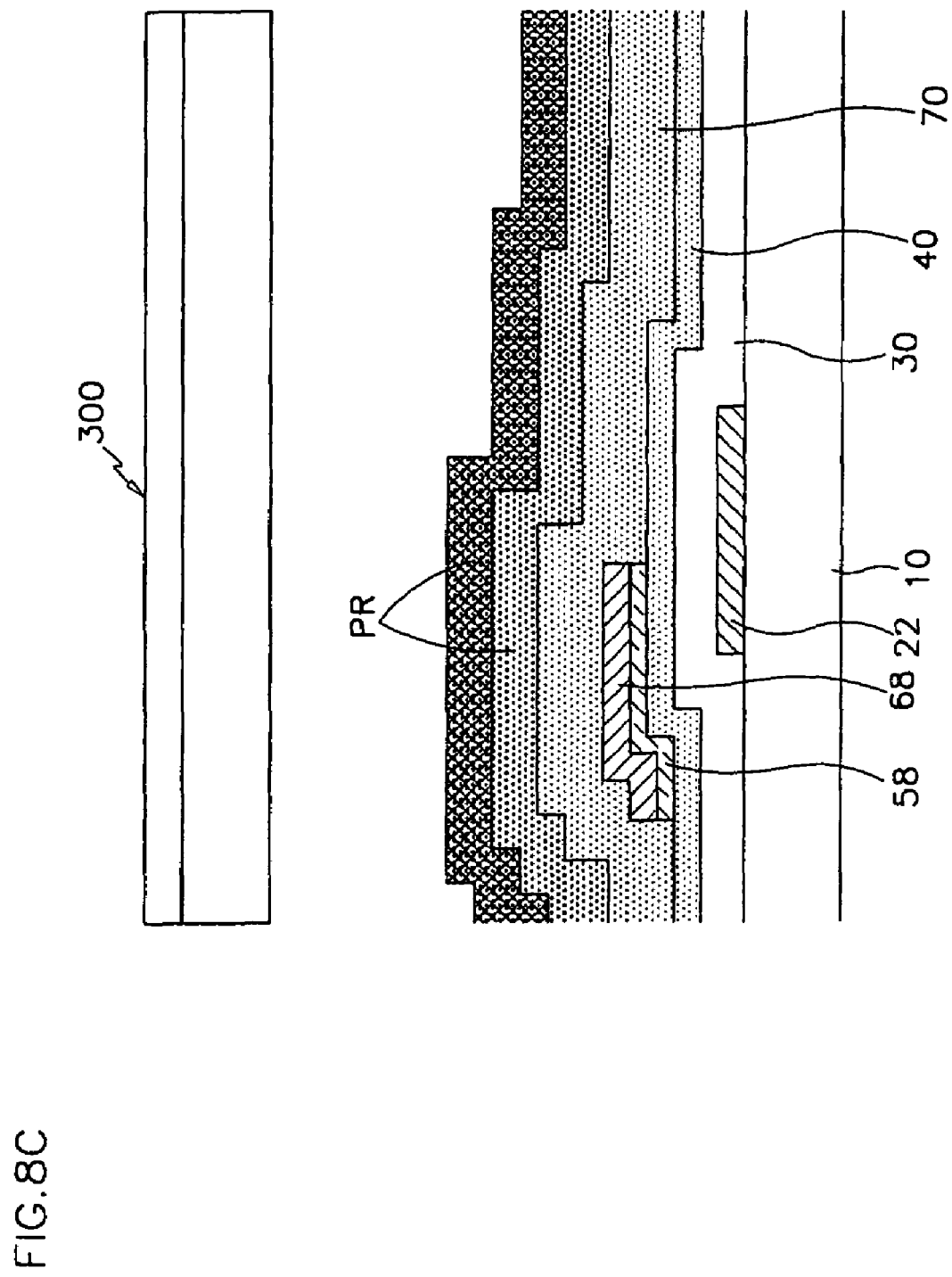

At first, a positive PR layer is coated to a thickness of 5,000 Å to 30,000 Å on the passivation layer 70, and exposed to light through a mask or masks 300, 410 and 420. The PR layer of the display area D, as shown in FIGS. 8B and 8C, is different from that of the peripheral area P. Polymers in regions C, the PR layer in the display area D, are exposed to the light and resolved to a certain depth, remaining intact beyond that depth. However, polymers in regions B the PR layer in the peripheral area P, are exposed to the light and wholly resolved from the surface to the bottom. The portions of the passivation layer 70 in the regions C and B are subject to being removed.

For this purpose, a mask portion 300 for the display area D may have structures different from mask portions 410 and 420 for the peripheral area P. Three such examples will be described with reference to FIGS. 9A to 11.

The first and second examples use two pieces of photomasks for the display area D and the peripheral area P.

Figure 9A:
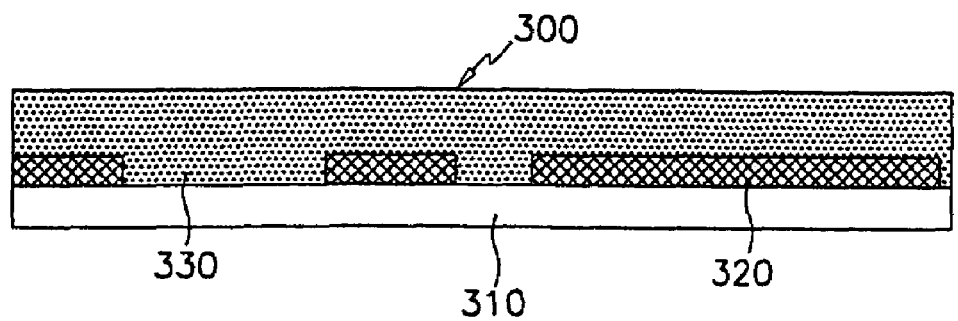
FIGS. 9A and 9B, FIGS. 10A and 10B and FIG. 11 are respectively the cross-sectional views of photomasks used in the manufacturing step of FIGS. 8A to 8C.
Figure 9B:
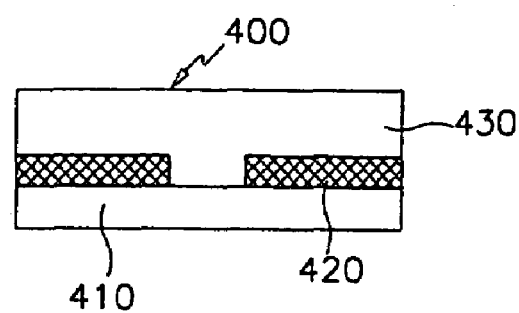

First, as shown in FIGS. 9A and 9B, masks 300 and 400 include mask substrates 310 and 410, opaque pattern layers 320 and 420 of such material as Cr thereon, and pellicles 330 and 430 covering the opaque pattern layer 320 and 420 and the exposed portions of the substrates 310 and 410 respectively. The light transmittance of the pellicle 330 of the mask 300 for the display area D is lower than that of the mask 400 for the peripheral area P. It is preferable that the light transmittance of the pellicle 330 is 10% to 80% of that of the pellicle 430, more preferably 20% to 60%.

Figure 10A:
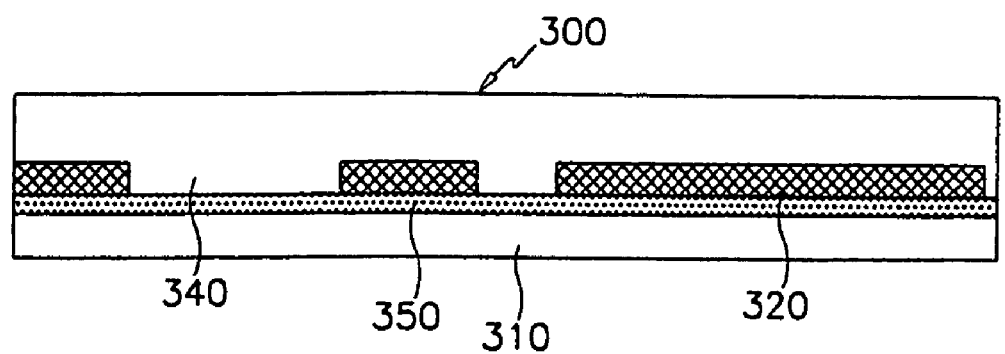
Figure 10B:
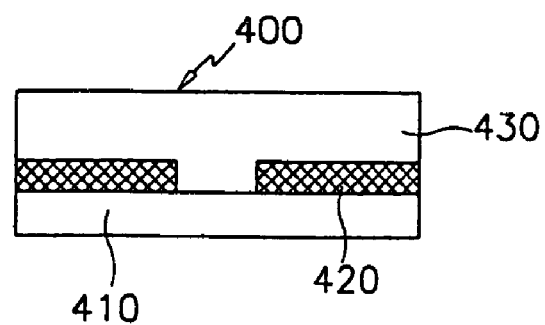

Next, as shown in FIGS. 10A and 10B, a Cr layer 350 with a thickness of 100 Å to 300 Å A is formed on a mask substrate 310 of a mask 300 for the display area D to reduce the light transmittance, while there is no Cr layer in a mask 400 for the peripheral area P. The light transmittance of a pellicle 340 of the mask 300 may be equal to that of a pellicle 430 of the mask 400.

A mixed structure of the above two may be available.

Above two examples are available for a divide-and-exposure method using a stepper, since the mask 300 for the display area D and the mask 400 for the peripheral area P are made of separate pieces. In the meantime, the thickness of the PR layer may be controlled by adjusting the exposure time.

However, the display area D and the peripheral area P may be exposed to light through a single mask. A structure of such a mask will be described with reference to FIG. 11.

Figure 11:
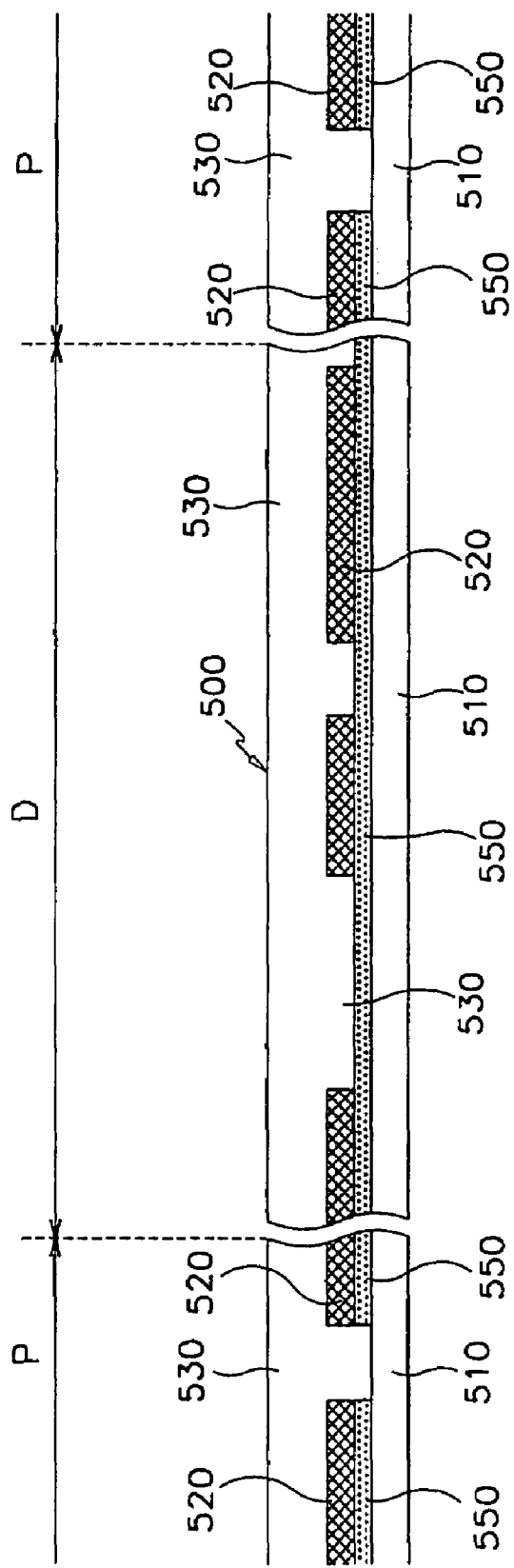

As shown in FIG. 11, a transmittance controlling layer 550 is formed on a substrate 510 for a photomask 500, and a pattern layer 520 is formed on the transmittance controlling layer 510. The transmittance controlling layer 550 is provided not only under the pattern layer 520 but also in the whole display area D, while only under the pattern layer 520 in the peripheral area P.

As a result, at least two patterns, one having the transmittance controlling layer 510 and the other having the double layer of the pattern layer 520 and the transmittance controlling layer 510, with different thickness are formed on the substrate 510.

A transmittance controlling layer may be provided in the area for the peripheral area P. At this time, the transmittance of the transmittance controlling layer for the peripheral area P should be higher than that for the display area D.

To manufacture a photomask 500 having the transmittance controlling layer 550, the transmittance controlling layer 550 and a pattern layer 520 that has an etch ratio different from the transmittance controlling layer 550 are sequentially deposited on the substrate 500. A PR layer (not shown) is coated on the pattern layer 520, exposed to light and developed. Then the pattern layer 520 is etched by using the PR layer as an etch mask. After removing the remaining PR layer, a new PR layer pattern (not shown) exposing portions of the transmittance controlling layer 550 that corresponds to contact holes of the peripheral area P is formed. Then, the transmittance controlling layer 550 is etched to complete the photomask 500.

In another way, the transmittance may be changed depending on position by using a mask that has slits or a grid pattern smaller than the resolution of the exposure equipment.

Meanwhile, portions of PR layer over the metal patterns such as the gate wire 22, 24 and 26 and the data wire 62, 64, 65, 66 and 68 having a high reflectivity may be exposed to more lights than other portions. To prevent this problem, a layer to block the reflected light by the metal patterns may be provided or a colored PR may be used.

The PR layer shown in FIG. 8B and 8C is exposed to light by the above described method, and developed to form a PR pattern shown in FIGS. 12A and 12B. In concrete, there is no PR remaining over a portion of the gate pad 24 and a portion of the data pad 64. Thick portion of the PR pattern in the region A are located in the peripheral area P except for the gate pad 24 and the data pad 64, and located over the data wire elements 62, 64 and 65, the drain electrode 66 and the portion of the semiconductor layer 40 between the data wire parts 62, 64 and 65 and the drain electrode 66 in the display area D. Thin portion of the PR pattern in the region C is located over a portion of the drain electrode 66 and the remaining portion of the display area D. The portion of PR pattern on the drain electrode 66 may be entirely removed. Furthermore, the thin portion of the PR pattern may also be located on the data pad 64 of the peripheral area P.

At this time, it is preferable that the thickness of the thin portions is ¼ to ⅐ of the initial thickness, in other words 350 Å 10,000 Å, and more preferably 1,000 Å to 6,000 Å. For example, when the initial thickness of the PR layer is 16,000 Å to 24,000 Å, the thin portion may have thickness of 3,000 Å to 7,000 Å by setting the transmittance for the display area D to 30%. However, since the thickness of the PR pattern should be determined by the dry etch condition, the transmittance of the pellicles, the thickness of the Cr layer, the transmittance of the transmittance controlling layer and the exposure time, etc., should be controlled depending on the etch condition.

The thin portion of the PR pattern may be formed by reflow after a normal exposure and a normal development.

Then, the PR pattern and the underlayers, i.e., the passivation layer 70, the semiconductor layer 40 and the gate insulating layer 30 are dry etched.

At this time, as described above, the portions of the PR pattern in the region A should remain, and the portions of the passivation layer 70, the semiconductor layer 40 and the gate insulating layer 30 in the region B should be removed. The portions of the passivation layer 70 and the semiconductor layer 40 in the region C should be removed, while the portions of the gate insulating layer 30 in the region C should remain. In addition, only the portions of the passivation layer 70 on the drain electrodes 66 in the region C are removed.

For this purpose, it is preferable to use a dry etch that may etch out the PR pattern along with the underlayers. As shown in FIGS. 13A and 13B, the three layers in region B of, the passivation layer 70, the semiconductor layer 40 and the gate insulating layer 30, and the three layers in region C of, the thin portions of the PR pattern, the passivation layer 70 and the semiconductor layer 40, may be etched at a time by dry etch.

Meanwhile, since the portions of the conductor layer 60 that will form a drain electrode 66 in the display area D, a data pad of the peripheral area P and a conductor pattern 68 for storage capacitors should not be removed, the etch condition should be set to have an etch selectivity against the conductor pattern 60. The thick portions of the PR pattern in the region A are also etched away to a certain depth.

In the meantime, the thin portions of the PR pattern may have a non-uniform thickness, the semiconductor layer 40 may remain to some extents on the gate insulating layer 30 in the region C. To prevent this problem, the PR pattern and the layers thereunder may be etched through several steps. It will be described in detail.

Figure 14A:
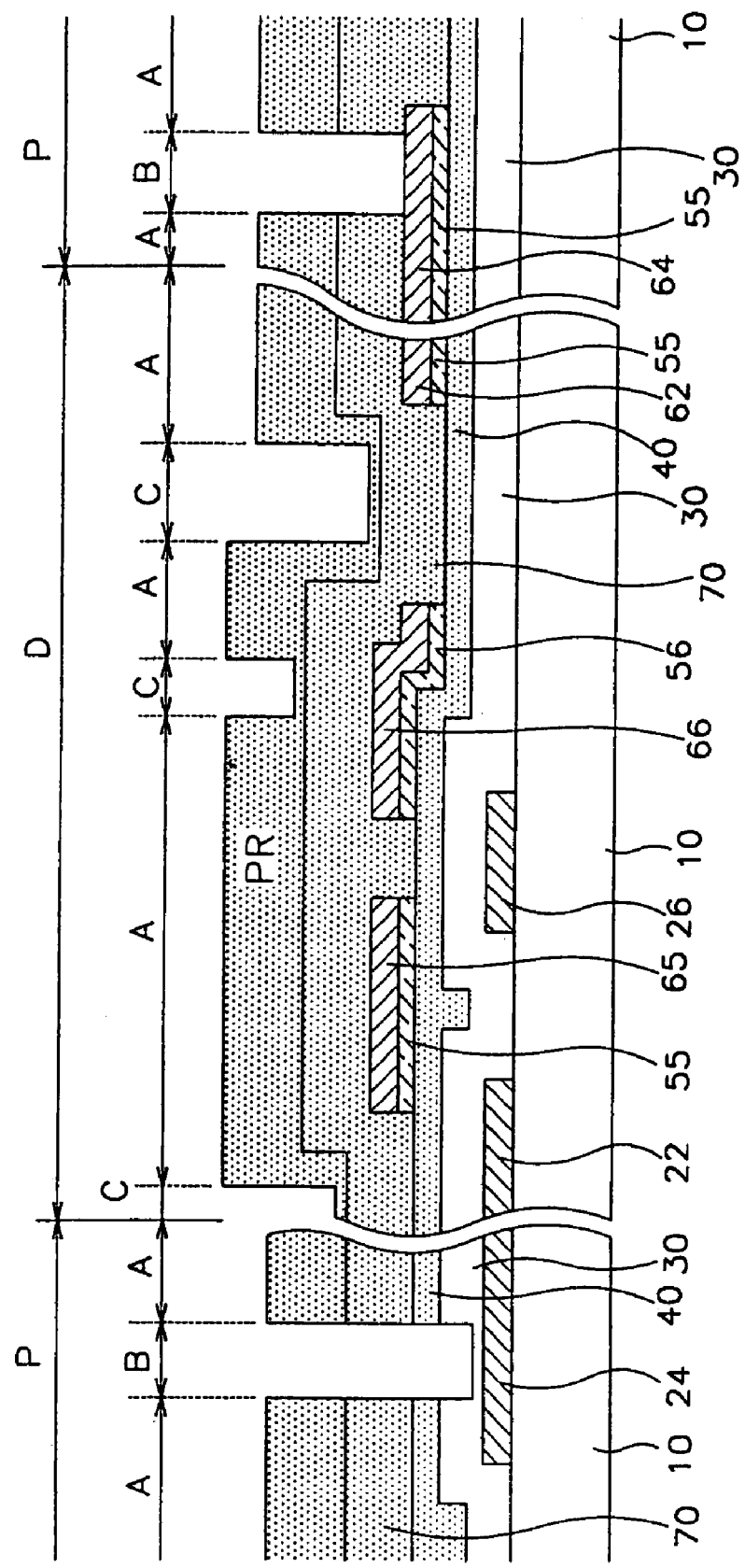
FIGS. 14A and 14B are respectively the cross-sectional views taken along the line VIIIB-VIIIB' and VIIIC-VIIIC' of FIG. 8A in the manufacturing step following FIGS. 13B and 13C.
Figure 14B:
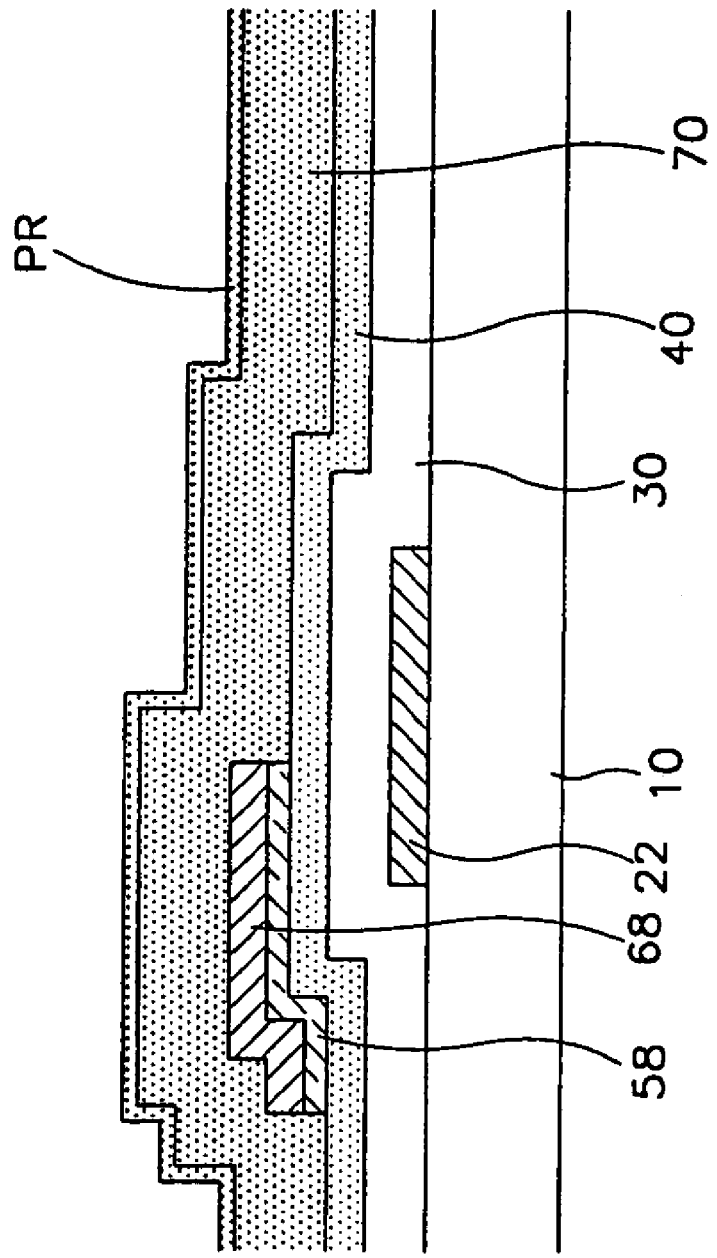

At first, as shown in FIGS. 14A and 14B, the portions, which are not covered with the PR pattern, of the passivation layer 70 and the layers thereunder, that is the semiconductor layer 40 and the gate insulating layer 30, are etched to expose the data pad 64. If there is no PR left over the drain electrode 66 in the previous step, the drain electrode 66 is also exposed at this time. However, the thin portions of the PR pattern may remain to a certain thickness enough not to expose the passivation layer 70 in the region C by controlling the etching amount of PR. This can be achieved by making the thin portions of the PR pattern in the region C to have an enough thickness in the previous step. The portions of the gate insulating layer 30 may be entirely removed or remain to a certain thickness as shown in FIG. 14A. At this time, etch gas mixtures such as $SF_6+HCl$ or $SF_6+N_2$ are used.

Figure 15A:
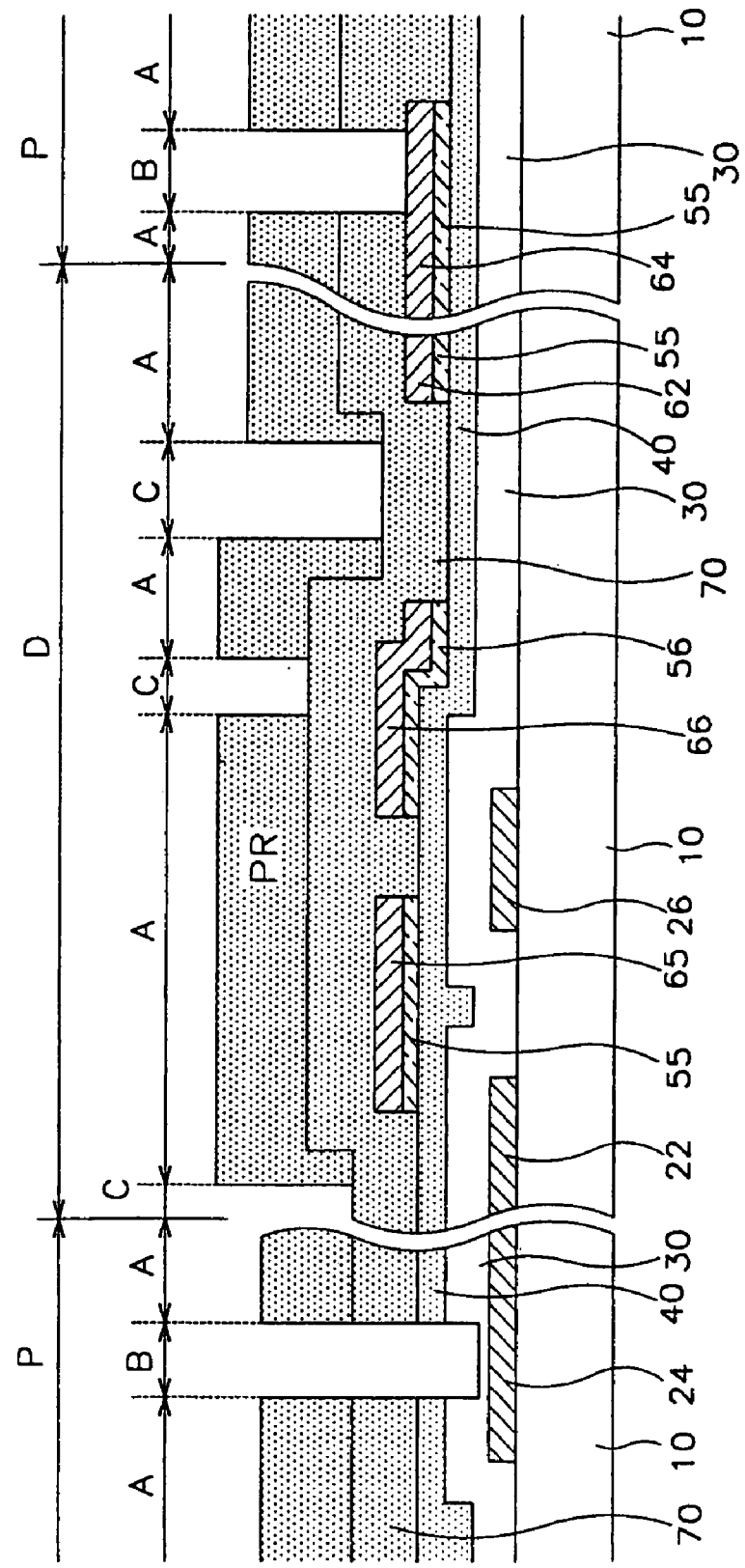
FIGS. 15A and 15B are respectively the cross-sectional views taken along the line VIIIB-VIIIB' and VIIIC-VIIIC' of FIG. 8A in the manufacturing step following FIGS. 14B and 14C.
Figure 15B:
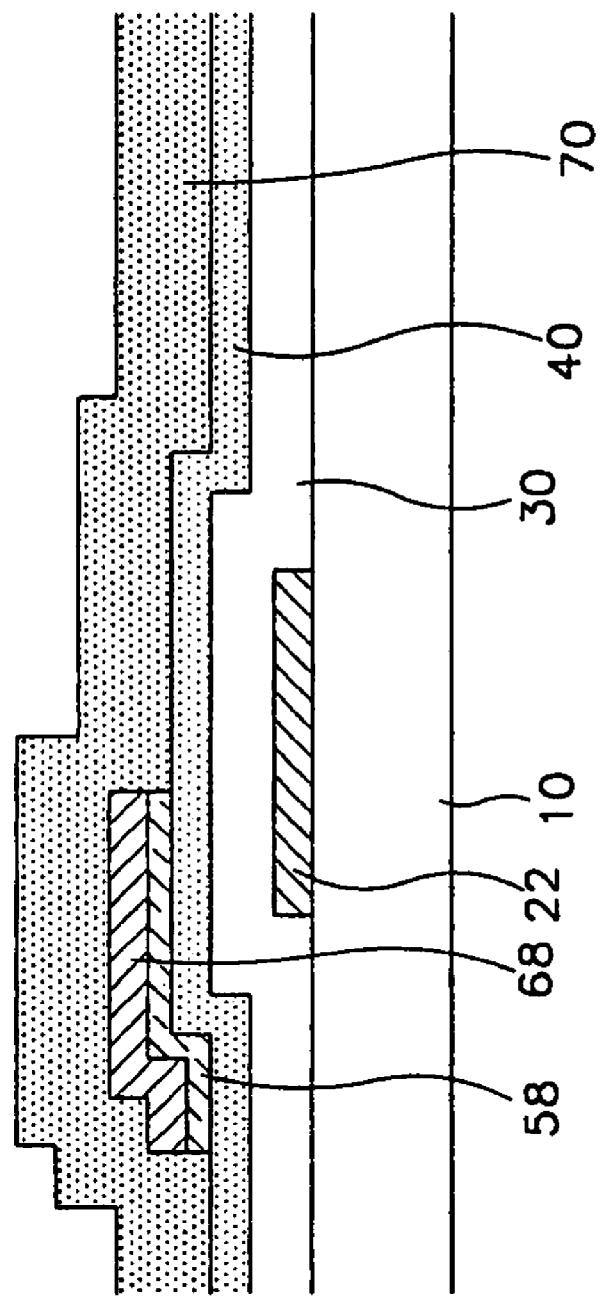

Next, as shown in FIGS. 15A and 15B, the residues of the PR pattern on the passivation layer 70 in the region C are removed by ashing process. At this time, the ashing process is performed for a period enough to remove the residual PR in the region C completely. It is preferable that the gas mixtures such as $N_2+O_2$ or $Ar+O_2$ are used for this ashing process.

Figure 16A:
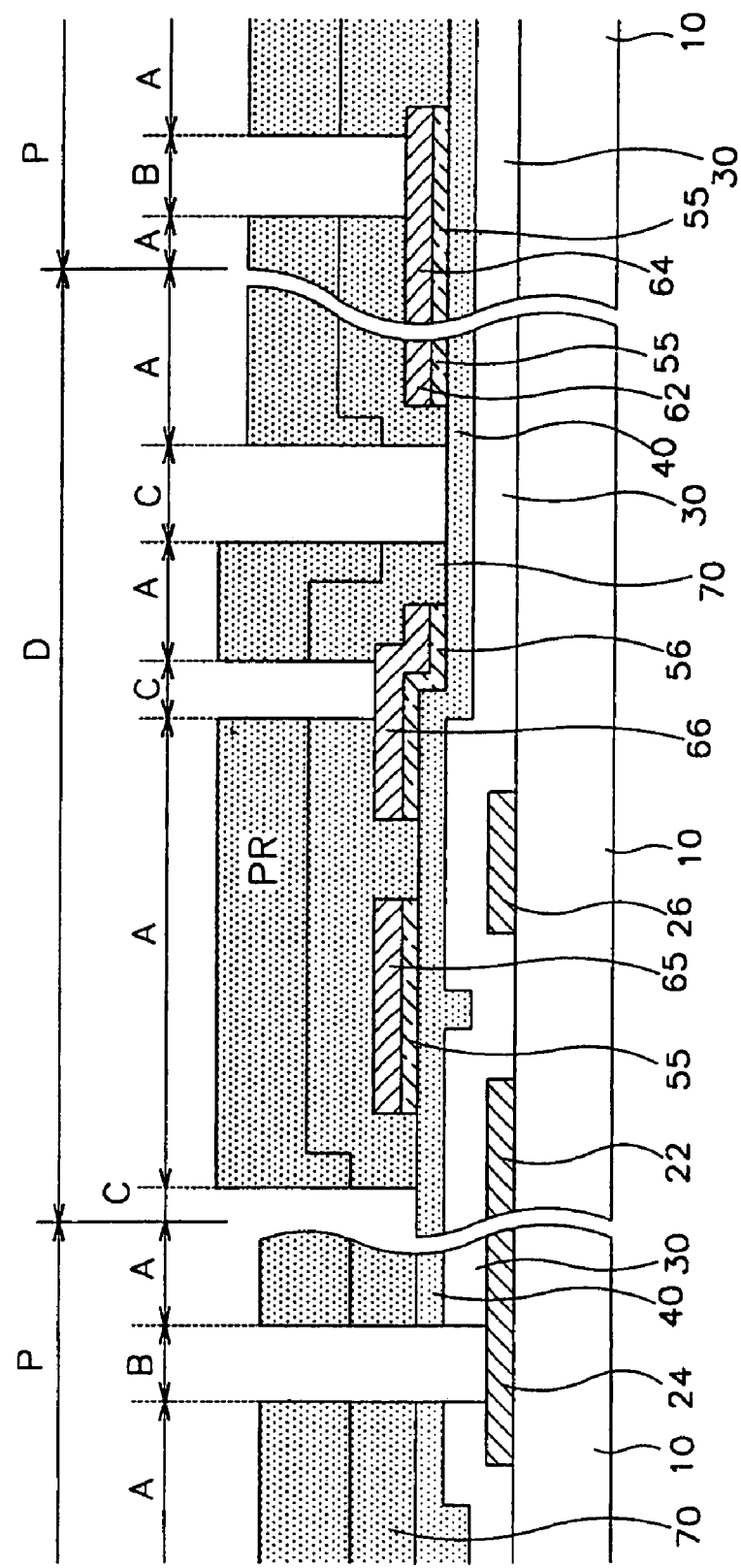
FIGS. 16A and 16B are respectively the cross-sectional views taken along the line VIIIB-VIIIB' and VIIIC-VIIIC' of FIG. 8A in the manufacturing step following FIGS. 15B and 15C.
Figure 16B:
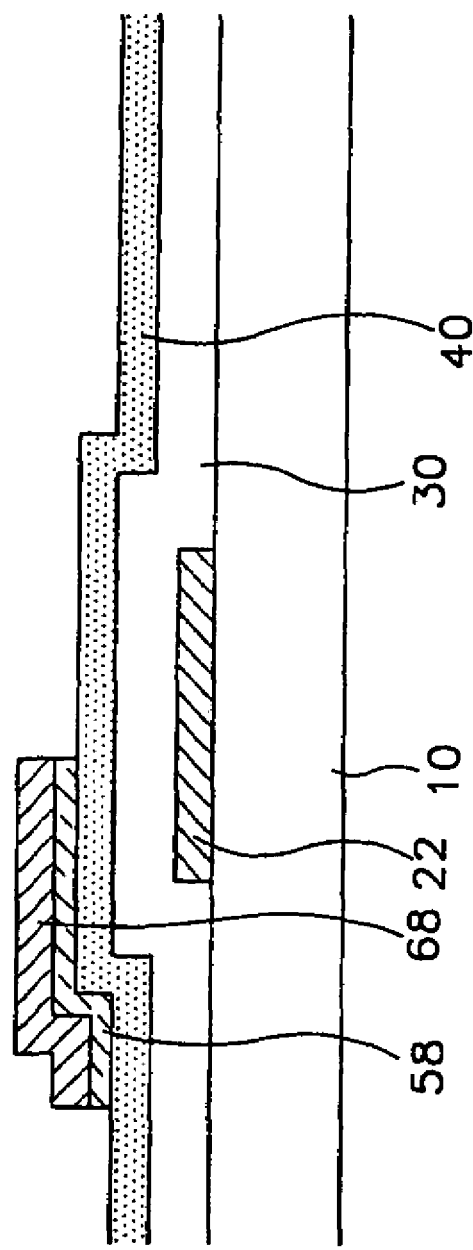

Then, as shown in FIGS. 16A and 16B, the exposed portions of the passivation layer 70 and the gate insulating layer 30 are removed to expose the semiconductor layer 40 in the display area D, the drain electrode 66 and the gate pad 24 by using the PR layer pattern as a mask and using an etch condition, which has a high etch selectivity between the semiconductor layer 40 and the gate insulating layer 30 and the passivation layer 70. At this time, to achieve an etch condition with a high etch selectivity, it is preferable that the etch gas mixtures have enough $O_2$ or $CF_4$. Examples of such gases are $SF_6+N_2$, $SF_6+O_2$, $CF_4+O_2$ and $CF_4+CHF_3+O_2$. The data pad 66 is exposed at this step, when the thin portion of the PR pattern was also formed on the data pad 66 as described above.

Figure 17A:
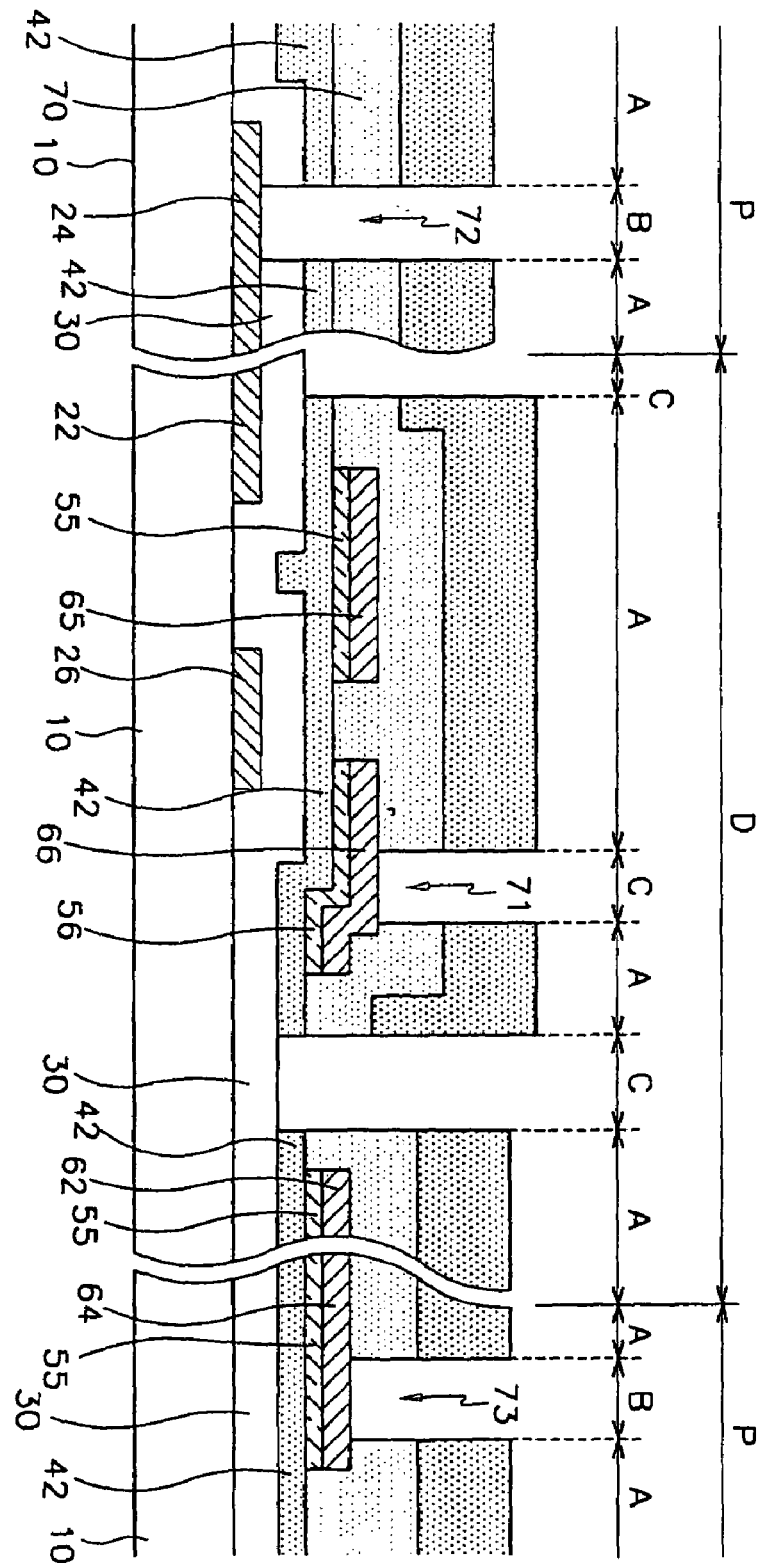
FIGS. 17A and 17B are respectively the cross-sectional views taken along the line VIIIB-VIIIB' and VIIIC-VIIIC' of FIG. 8A in the manufacturing step following FIGS. 16B and 16C.
Figure 17B:
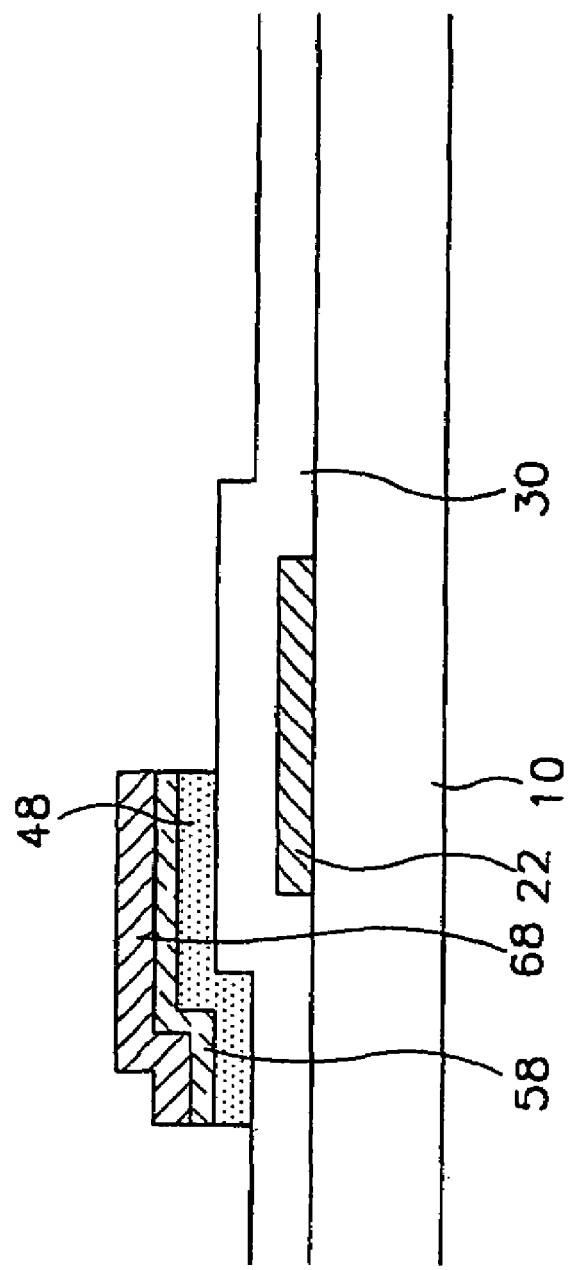

Next, as shown in FIGS. 17A and 17B, the exposed portions of the semiconductor layer 40 are etched to complete the semiconductor pattern 42 and 48 by using an etch condition that only etches amorphous silicon. At this time, it is preferable that etch gas systems such as $Cl_2+O_2$ and $SF_6+HCl+O_2+Ar$ are used for this etching step.

The above embodiments remove the passivation layer 70 and the semiconductor layer 40 along with the gate insulating layer 30 to form the contact hole 71 and the semiconductor pattern 42 and 48 in the display area D, and remove the passivation layer 70, the semiconductor layer 40 and the gate insulating layer 30 to form contact holes 72 and 73 by only one photolithography step.

The PR of the region A is also stripped when removing the PR pattern of the region C by the ashing process, and the passivation layer 70 and the semiconductor layer 40 are etched out at this time. To prevent the passivation layer 70 from being exposed or removed by overetch of the PR layer, it is preferable that the PR layer is coated to a thickness enough not to be overetched or an etch condition having a high etch selectivity between the PR layer and the semiconductor layer 40 or between the PR layer and the passivation layer 70.

Next, the remaining PR pattern of the region A is removed. Then, as shown in FIGS. 3 to 5, a ITO layer with a thickness of 400 Å to 500 Å is deposited and etched to form a pixel electrode 82, a redundant gate pad 84 and the redundant data pad 86 by using a fourth photolithography step.

In the above described embodiment, the passivation layer 70, the semiconductor layer 40 and the gate insulating layer 30 are etched along with the PR pattern having a thickness that varies depending on the locations after forming the PR pattern through coating, exposure and development. However, the passivation layer 70 may be formed with a photosensitive material such as product code PC 403 supplied by JSR Co. of Japan. Then, the passivation layer 70 is patterned through exposure and development to have a different thickness according to the location, and the semiconductor layer 40 and the gate insulating layer 30 are etched along with the passivation layer 70. According to this method, the PR coating step and the PR stripping step may be omitted.

In this embodiment, there is no PR left in the region B. However, the region B may have a portion of the PR pattern that is thinner than those of the PR patterns in the A and C regions. In this case, the portion in the region B may be removed by ashing. In addition, the three portions of the PR pattern may be located wherever that is necessary by changing the positions of the transmittance controlling layers of the photomask or the photomasks.

A TFT array panel according to a second embodiment of the present invention will be described.

Figure 18:
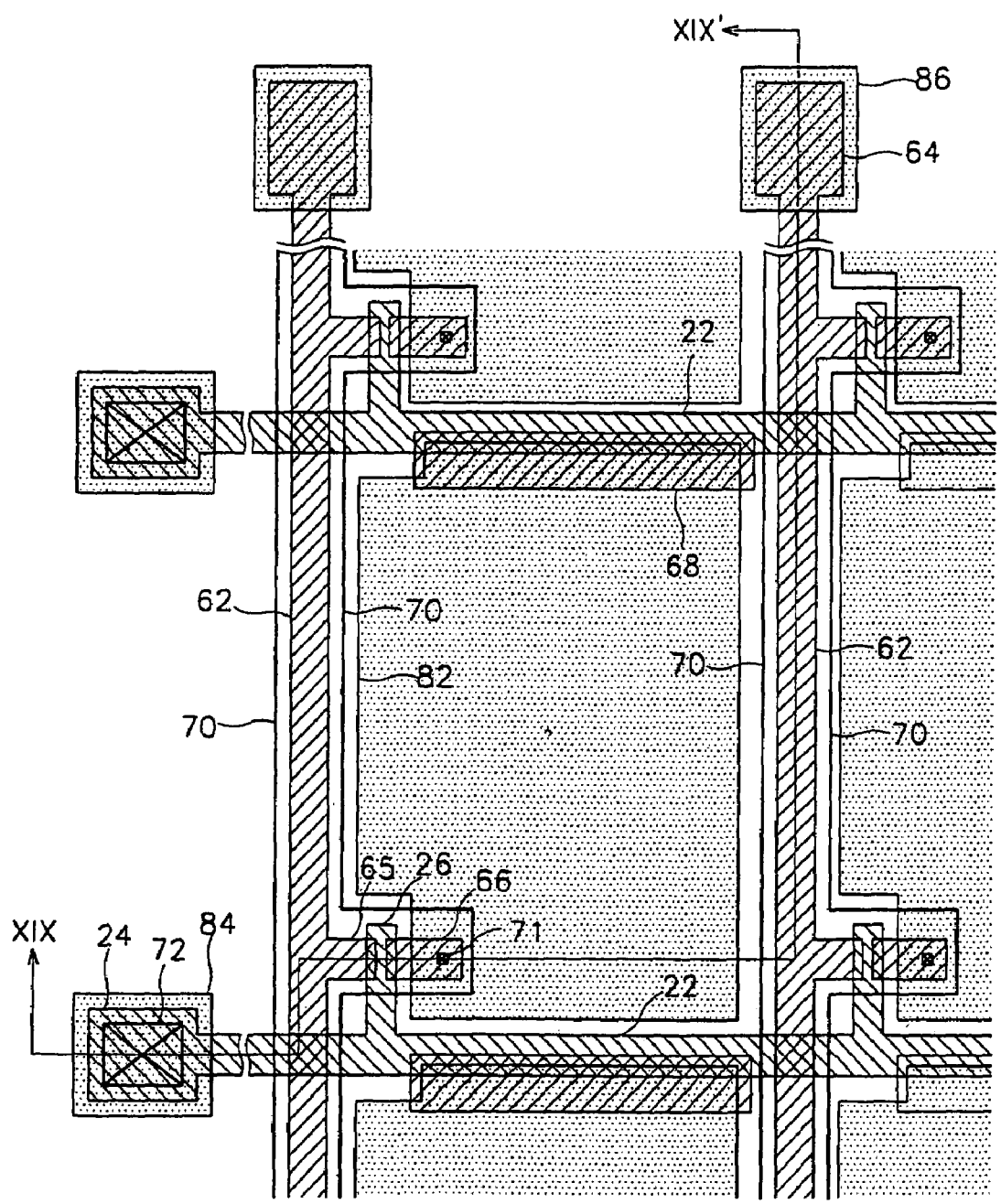
FIG. 18 is a layout view of a TFT array panel for an LCD according to a second embodiment of the present invention.
Figure 19:
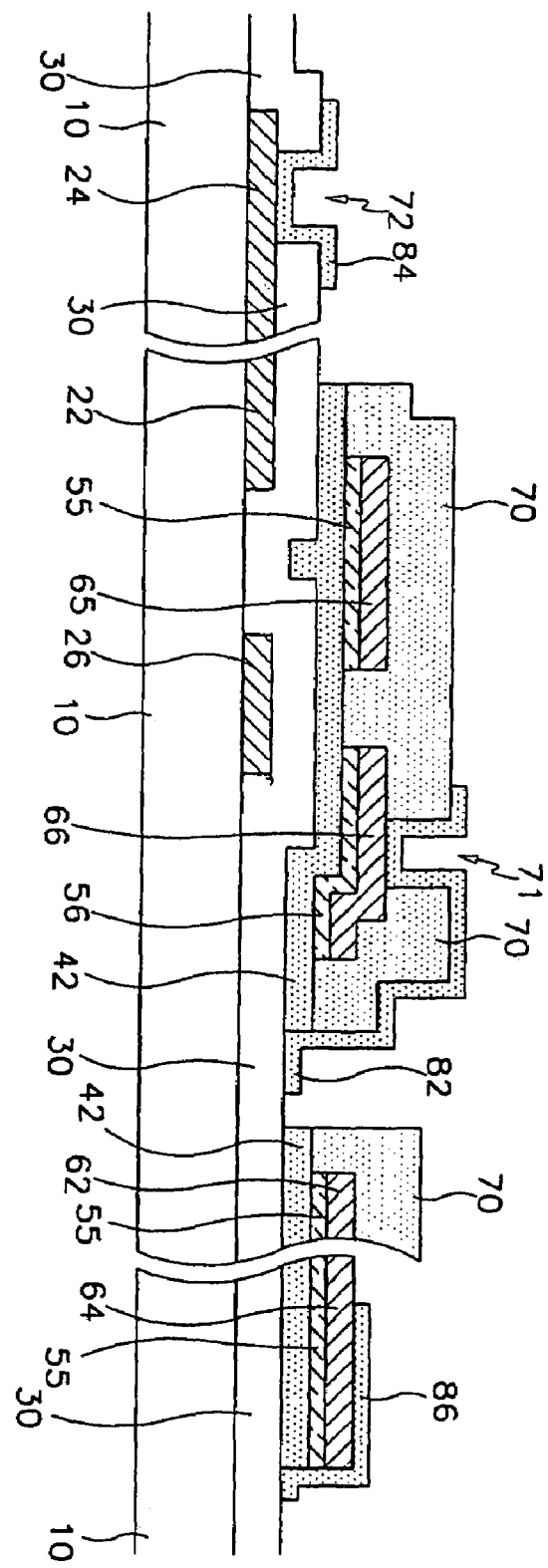
FIG. 19 is a cross-sectional view taken along the line XIX-XIX' in FIG. 18.

FIG. 18 is a layout view of a TFT array panel for an LCD according to a second embodiment of the present invention, and FIG. 19 is a cross-sectional view taken along the line XIX-XIX' in FIG. 18.

The TFT array panel according to the second embodiment is almost the same as that of the first embodiment except that no portions of a semiconductor layer pattern 42 and a passivation layer pattern 70 are located in the peripheral area P. In other word, only a gate insulating layer 30 having a contact hole 72 exposing a gate pad 30 is formed in the peripheral area P. Therefore, a redundant gate pad 84 is formed on the gate insulating layer 30 and connected to the gate pad 24 through the contact hole 72, and a redundant data pad 86 is formed directly on a data pad 64.

Meanwhile, the gate insulating layer 30 may also be removed in the peripheral area P. Therefore, the redundant gate pad 84 may be formed directly on the gate pad 24.

Now, a method of manufacturing a TFT array panel according to the second embodiment of the present invention will be described with reference to FIGS. 20A to 22 as well as FIGS. 18 and 19.

The steps of forming gate wire 22, 24 and 26, sequential deposition of a gate insulating layer 30, a semiconductor layer 40, ohmic contact layer 50 and a: conductor layer 60, and patterning the conductor layer 40 and the ohmic contact layer 50 to form a data wire 62, 64, 65 and 66 and a conductor pattern 68 for storage capacitor and an ohmic contact layer pattern 55, 56 and 58 thereunder are similar to that of the first embodiment.

Figure 20A:
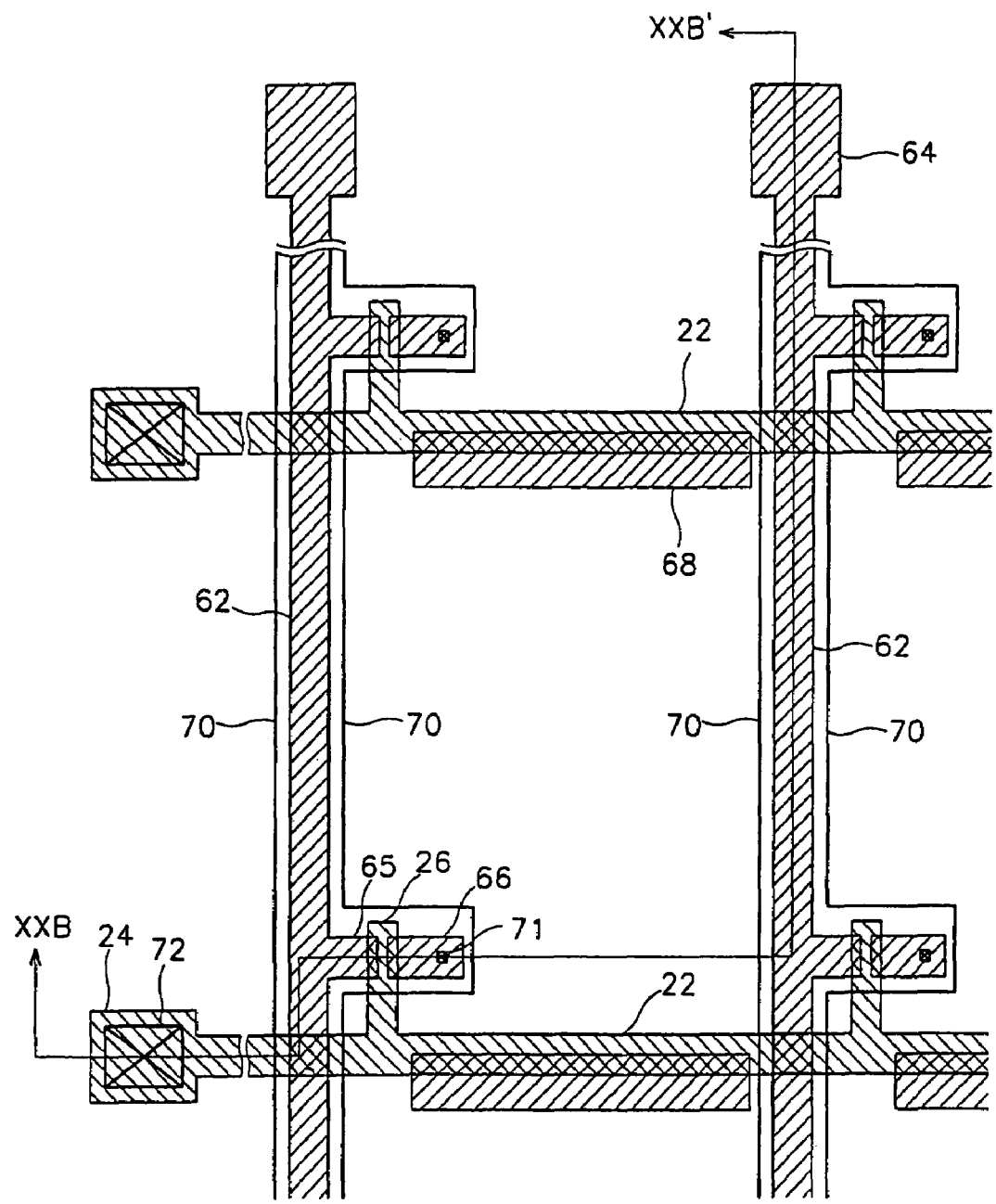
FIG. 20A is a layout view of a TFT array panel in a manufacturing step of the manufacturing method according to the second embodiment of the present invention.
Figure 20B:
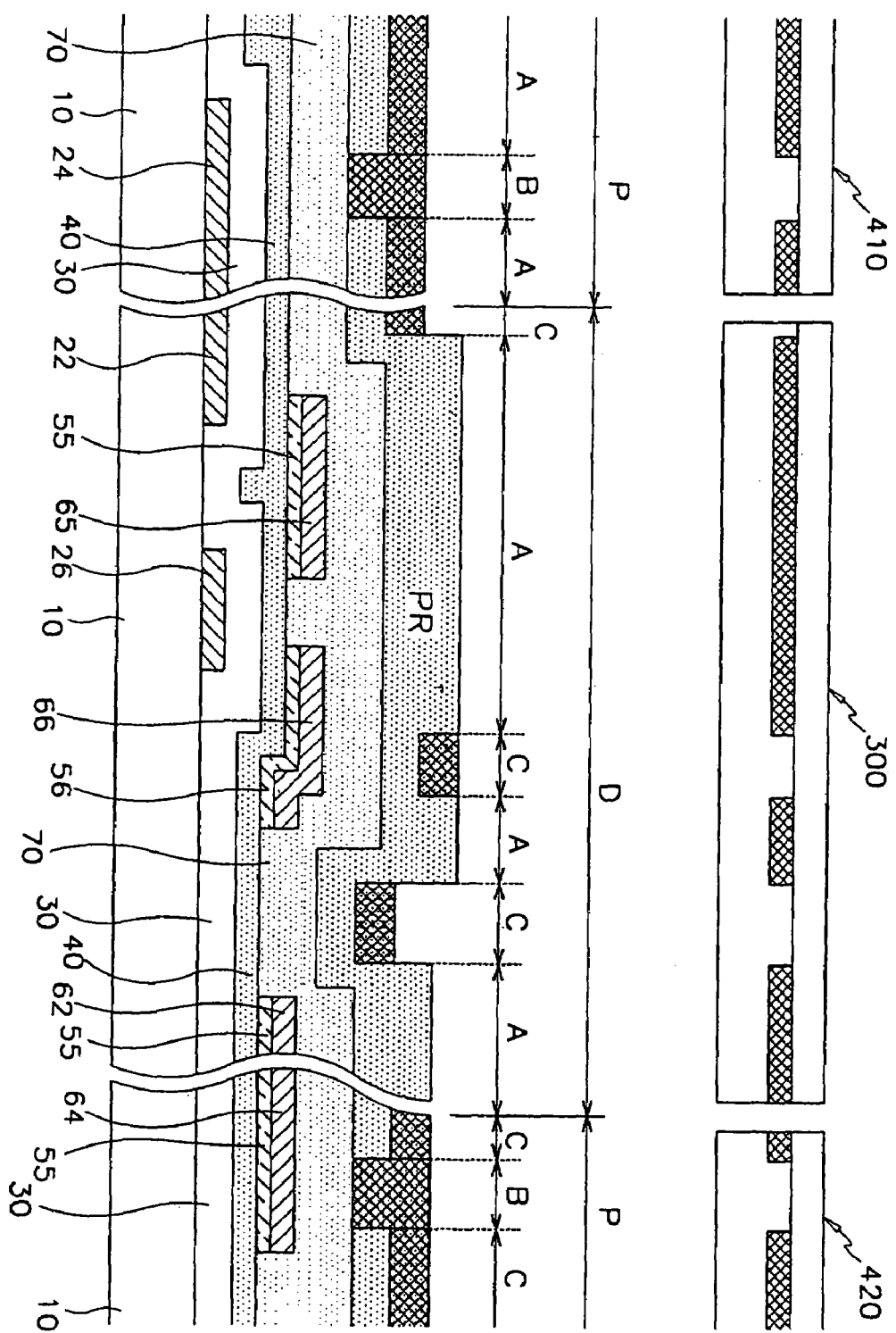
FIG. 20B is the cross-sectional view taken along the line XXB-XXB' in FIG. 20A.
Figure 22:
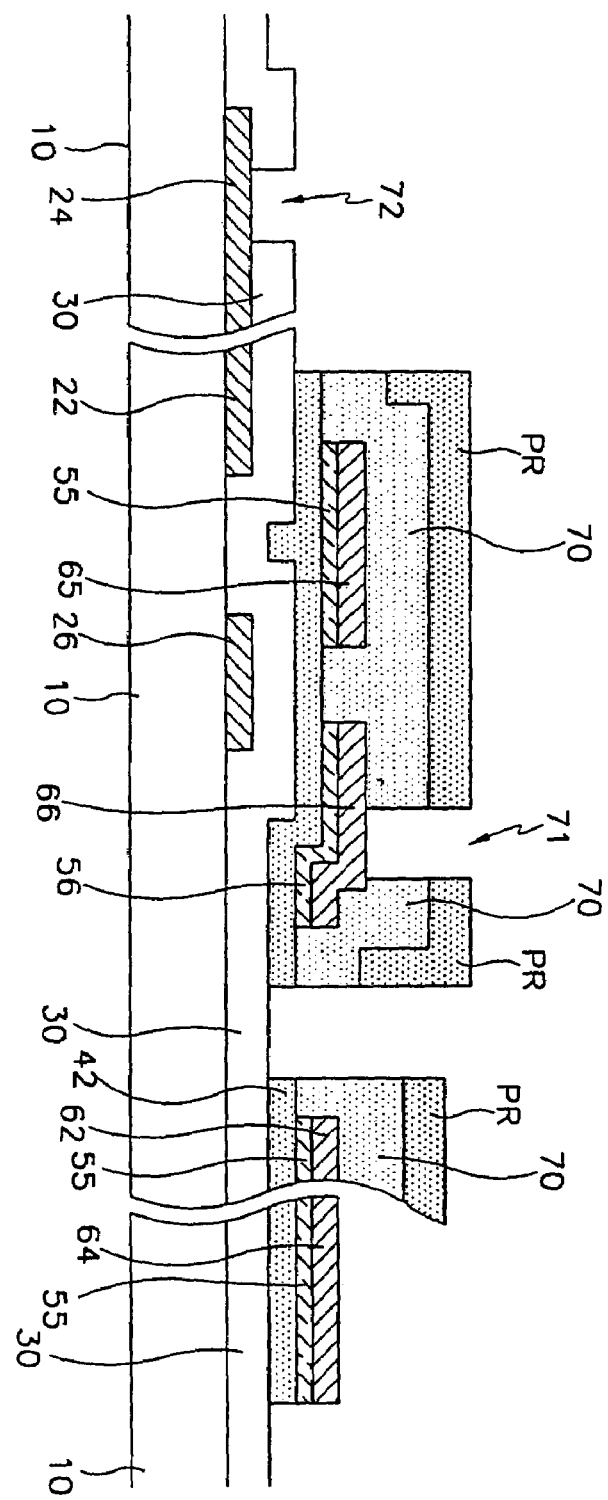

As shown in FIGS. 20A and 22, a passivation layer 70 with a thickness over 3,000 Å is deposited by CVD of SiNx or spin coated using organic insulator. Then, the passivation layer 70, the semiconductor layer 40 and the gate insulating layer 30 are patterned to form their patterns having contact holes 71 and 72 by a third photolithography step. At this time, in the peripheral area P, the portions of the passivation layer 70, the semiconductor layer 40 and the gate insulating layer 30 on the gate pad 24 and the other portions of the passivation layer 70 and the semiconductor layer 40 are removed (and the portions of the passivation layer 70 on the data pads 64 are also removed). However, in the display area, only the portions of the passivation layer 70 and the semiconductor layer 40 are removed (and the portions of the passivation layer 70 on the drain electrodes 66 are also removed) to form a semiconductor pattern. For this purpose, as described in the first embodiment, a photoresist (PR) pattern is formed to have a thickness that varies depending on the location, and the layers under the PR pattern are dry etched by using the PR pattern as an etch mask.

Figure 21:
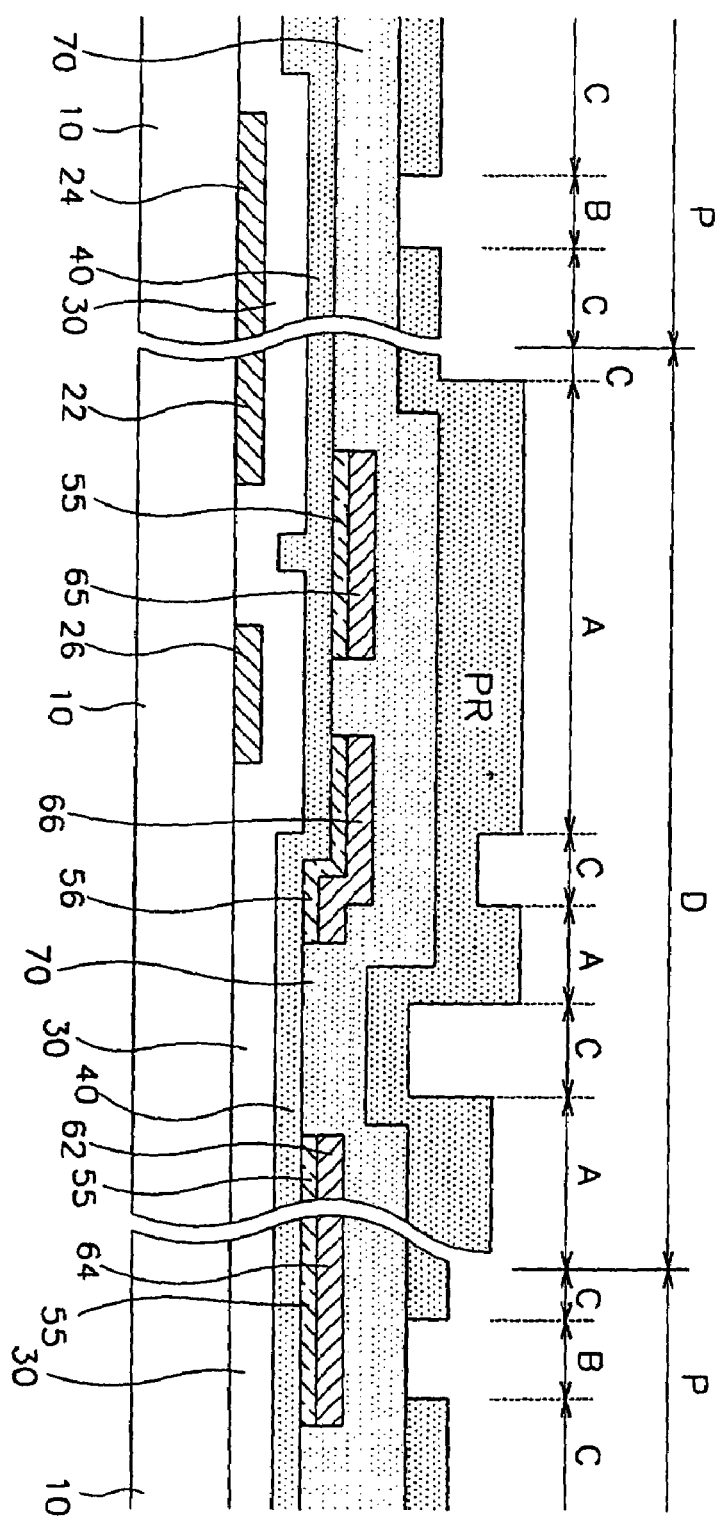
FIGS. 21 and 22 are cross-sectional views taken along the line XXB-XXB' in FIG. 20A, in the next manufacturing steps of FIGS. 20A and 20B.

The method of forming the PR pattern having a thickness that varies depending on the location is the same as that of the first embodiment. However, the shape of the PR pattern is different from that of the first embodiment. In other word, in the peripheral area P, the PR pattern has the portion B having zero thickness and the portion C having thin thickness as shown in FIG. 21.

The process of etching the passivation layer 70, the semiconductor layer 40 and gate insulating layer 30 by using the PR pattern as an etch mask is also the same as that of the first embodiment.

Now, the photolithography method used in the above described embodiment will be described in detail.

FIGS. 23A to 23E are cross sectional views of thin films manufactured by a photolithography method according to an embodiment of the present invention.

Figure 23A:
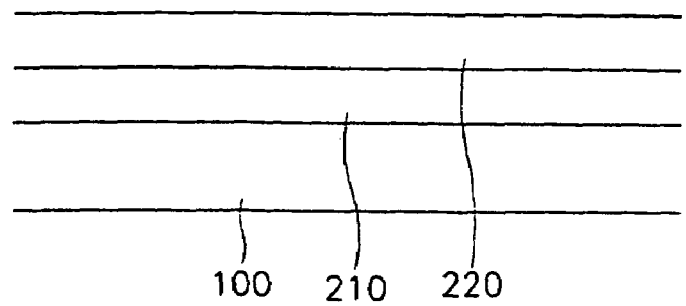
FIGS. 23A to 23E are cross sectional views of this films manufactured by the photolithography method according to the present invention.

At first, as shown in FIG. 23A, a first and a second thin film 210 and 220 are sequentially deposited on a substrate 100. The first and the second thin film 210 and 220 are the films that will be patterned by the present photolithography method, and are corresponding to those like the passivation layer, the semiconductor layer and the insulating layer in the above described embodiment.

Figure 23B:
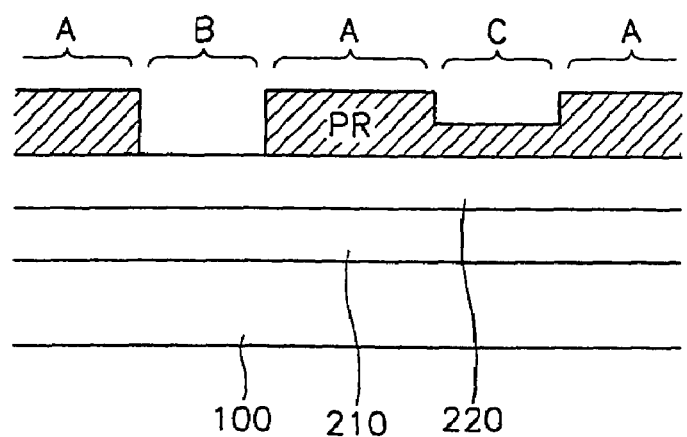

Next, as shown in FIG. 23B and described above, a PR layer is coated, exposed by using a photomask or photomasks having a transmittance varying depending on the position and developed to form a PR pattern having thickness varying depending on the location. In FIG. 18B, the portion of the PR layer in the region B is entirely removed and the portion in the region C is stripped to have a thinner thickness than the portion A.

Figure 23C:
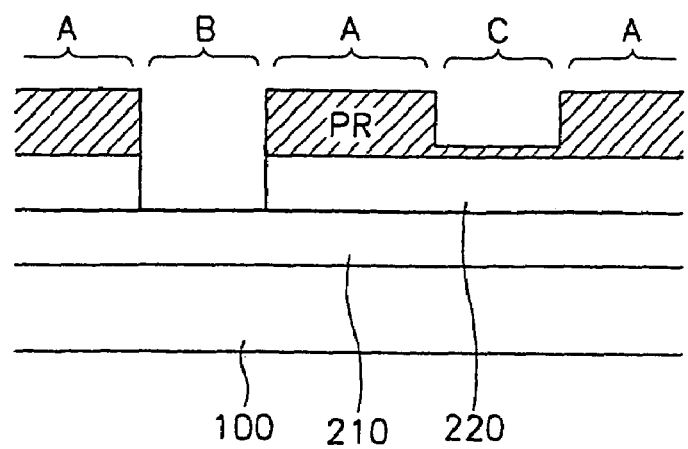

Next, as shown in FIG. 23C, the second thin film 220 is etched by using the PR pattern as etch mask. At this time, according to the etch condition, the PR pattern may also be etched to a certain degree, but it is preferable that the thin portion of the PR pattern in the region C remains to a certain thickness in order to control the etching depth precisely. However, the thin portion of the PR pattern and the second thin film 220 thereunder in the region C, and the first thin film 210 in the region B may be etched at a time under an etch condition where the etch ratio for the PR pattern is similar to that for the thin films 210 and 220.

Figure 23D:
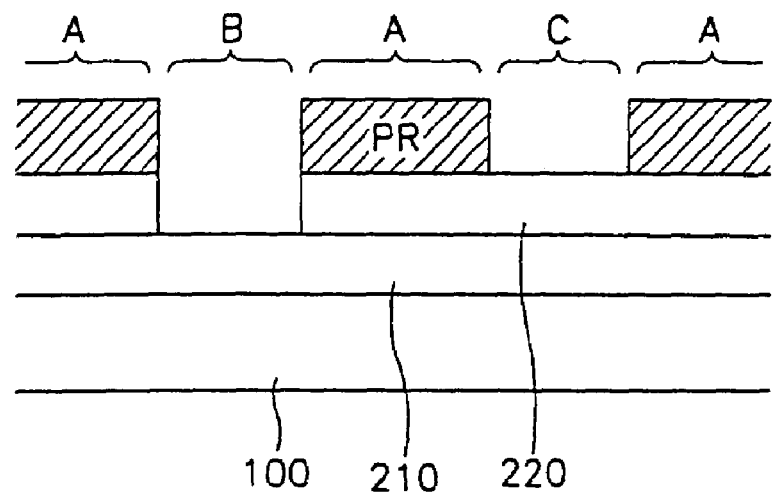
Figure 23E:
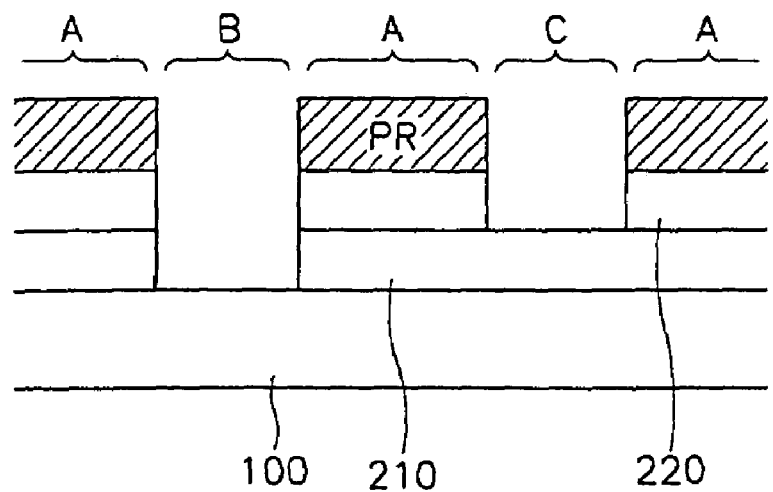

Next, as shown in FIG. 23D, the residual PR in the region C is removed by ashing. The etching gas should be selected so that the etch ratio for the PR pattern is sufficiently larger than that for the thin films 210 and 220. $N_2+O_2$ and $Ar+O_2$ are examples of such etching gas mixtures. In addition, the ashing is performed for a period enough to remove the thin portion of PR completely. However, the thick portions of the PR pattern in the region A should remain to a certain thickness, since the thick portions serve as an etch mask in the following step of etching thin films 210 and 220.

Next, the exposed portion of the first thin film 210 in the region B and the exposed portion of the second thin film 220 in the region C are etched by using the remaining PR pattern as an etch mask.

In this embodiment, the two thin films 210 and 220 are deposited, and the portions of both thin film 210 and 220 in the region B are removed while the portion of only the upper film 220 in the region C is removed by using a single photolithography step. However, according to the present invention, a thin film may be patterned to have etch depths that vary according to the location.

In this embodiment, the gate insulating layer pattern 30 having the contact holes 72 exposing the gate pads 24 is formed along with the passivation layer pattern 70 and the semiconductor layer pattern 42 and 48 by one photolithography step. However, the gate insulating layer pattern 30 may be patterned along with at least any one layer among the semiconductor pattern, the ohmic contact layer pattern, the data wire, the passivation layer pattern and the pixel electrodes. In particular, the present invention is useful for patterning a thin film or films using dry etch.

Though, in the present embodiment, the pixel electrode is formed in a wide planar shape, but it may be formed in a linear shape. Furthermore, a common electrode that drives liquid crystal molecules along with the pixel electrode may be formed on the same substrate as the pixel electrode.

According to the present invention, the manufacturing method may be simplified by reducing the manufacturing steps, thereby reducing the manufacturing cost and enhancing the yield. Furthermore, it is possible to etch a wide area of layer to a variant thickness depending on the location at the same time and to achieve a uniform thickness where a layer should remain to a certain thickness.

In the drawings and specification, there have been disclosed typical preferred embodiments of the present invention and, although specific terms are employed, they are used in a generic and descriptive sense only and not for purposes of limitation, the scope of the invention being set forth in the following claims.

What is claimed is:

1. A thin film transistor (TFT) array panel, comprising:
    a substrate;
    a gate wire formed on the substrate and including a gate line, a gate electrode and a gate pad;
    a gate insulating layer pattern formed on the gate wire and having a contact hole exposing the gate pad;
    a semiconductor layer pattern formed on the gate insulating layer pattern;
    an ohmic contact layer pattern formed on the semiconductor layer pattern;
    a data wire formed on the ohmic contact layer pattern, including a data line, a source electrode, a drain electrode and a data pad;
    a passivation layer pattern formed on the data wire, having contact holes exposing the gate pad, the data pad and the drain electrode; and
    a pixel electrode electrically connected to the exposed portion of the drain electrode,
    wherein the ohmic contact layer pattern includes a portion disposed under the data pad and having a planar shape substantially the same as that of the data pad due to simultaneous etching and wherein the contact hole of the passivation layer, exposing the gate pad coincide with the contact hole of the gate insulating layer due to simultaneous etching.

2. The TFT array panel of 1, further comprising a storage electrode formed over the gate line, wherein the semiconductor layer pattern and the ohmic contact layer pattern have a portion interposed between the storage electrode and the gate line, and the storage electrode is connected to the pixel electrode.

3. The TFT array panel of 1, further comprising a redundant gate pad and a redundant data pad covering the gate pad and the data pad, respectively.

* * * * *